United States Patent
Mahgerefteh et al.

(10) Patent No.: US 10,317,632 B2
(45) Date of Patent: Jun. 11, 2019

(54) SURFACE COUPLED LASER AND LASER OPTICAL INTERPOSER

(71) Applicant: Finisar Corporation, Sunnyvale, CA (US)

(72) Inventors: Daniel Mahgerefteh, Los Angeles, CA (US); Jin-Hyoung Lee, Sunnyvale, CA (US); Shiyun Lin, San Diego, CA (US)

(73) Assignee: Finisar Corporation, Sunnyvale, CA (US)

( * ) Notice: Subject to any disclaimer, the term of this patent is extended or adjusted under 35 U.S.C. 154(b) by 9 days.

(21) Appl. No.: 15/834,040

(22) Filed: Dec. 6, 2017

(65) Prior Publication Data
US 2018/0156992 A1 Jun. 7, 2018

Related U.S. Application Data

(60) Provisional application No. 62/430,797, filed on Dec. 6, 2016.

(51) Int. Cl.
*G02B 6/42* (2006.01)
*G02B 6/12* (2006.01)
(Continued)

(52) U.S. Cl.
CPC ....... *G02B 6/4214* (2013.01); *G02B 6/12002* (2013.01); *G02B 6/12004* (2013.01);
(Continued)

(58) Field of Classification Search
CPC ...... G02B 6/12004; G02B 6/124; G02B 6/34; G02B 6/4214; G02B 2006/12157; H01S 5/0064; H01S 5/187
See application file for complete search history.

(56) References Cited

U.S. PATENT DOCUMENTS 7,194,016 B2 * 3/2007 Bullington ............... G02B 6/34
372/108
9,031,365 B2 * 5/2015 Park ...................... H04B 10/27
385/36
(Continued)

FOREIGN PATENT DOCUMENTS

| EP | 0 623 980 A2 | 11/1994 |
|----|--------------|---------|
| WO | 2016/011002 A1 | 1/2016 |
| WO | 2017/106880 A1 | 6/2017 |

OTHER PUBLICATIONS

International Search Report and Written Opinion dated Mar. 9, 2018, in related PCT Application No. PCT/US2017/064959 (14 pages).

*Primary Examiner* — Daniel Petkovsek
(74) *Attorney, Agent, or Firm* — Maschoff Brennan

(57) ABSTRACT

An example system includes a grating coupled laser, a laser optical interposer (LOI), an optical isolator, and a light redirector. The grating coupled laser includes a laser cavity and a transmit grating optically coupled to the laser cavity. The transmit grating is configured to diffract light emitted by the laser cavity out of the grating coupled laser. The LOI includes an LOI waveguide with an input end and an output end. The optical isolator is positioned between the surface coupled edge emitting laser and the LOI. The light redirector is positioned to redirect the light, after the light passes through the optical isolator, into the LOI waveguide of the LOI.

26 Claims, 19 Drawing Sheets

(51) Int. Cl.
*G02B 6/122* (2006.01)
*G02B 6/34* (2006.01)
*H01S 5/022* (2006.01)
*G02B 6/124* (2006.01)
*H01S 5/00* (2006.01)
*H01S 5/187* (2006.01)

(52) U.S. Cl.
CPC ............ *G02B 6/1228* (2013.01); *G02B 6/34* (2013.01); *H01S 5/0228* (2013.01); *H01S 5/02252* (2013.01); *G02B 6/124* (2013.01); *G02B 2006/12157* (2013.01); *H01S 5/005* (2013.01); *H01S 5/0064* (2013.01); *H01S 5/0071* (2013.01); *H01S 5/187* (2013.01)

(56) References Cited

U.S. PATENT DOCUMENTS

| | | | |
|---|---|---|---|
| 9,091,827 B2* | 7/2015 | Verslegers | G02B 5/1861 |
| 9,176,291 B2* | 11/2015 | Li | G02B 6/12004 |
| 9,405,066 B2 | 8/2016 | Mahgerefteh et al. | |
| 9,613,886 B2* | 4/2017 | Lin | H01S 5/0208 |
| 2010/0006784 A1 | 1/2010 | Mack et al. | |
| 2015/0205062 A1* | 7/2015 | Collins | G02B 6/34 |
| | | | 385/14 |
| 2016/0294155 A1 | 10/2016 | Zheng et al. | |
| 2017/0179680 A1* | 6/2017 | Mahgerefteh | G02B 6/12004 |
| 2017/0207600 A1* | 7/2017 | Klamkin | H01S 5/02292 |

\* cited by examiner

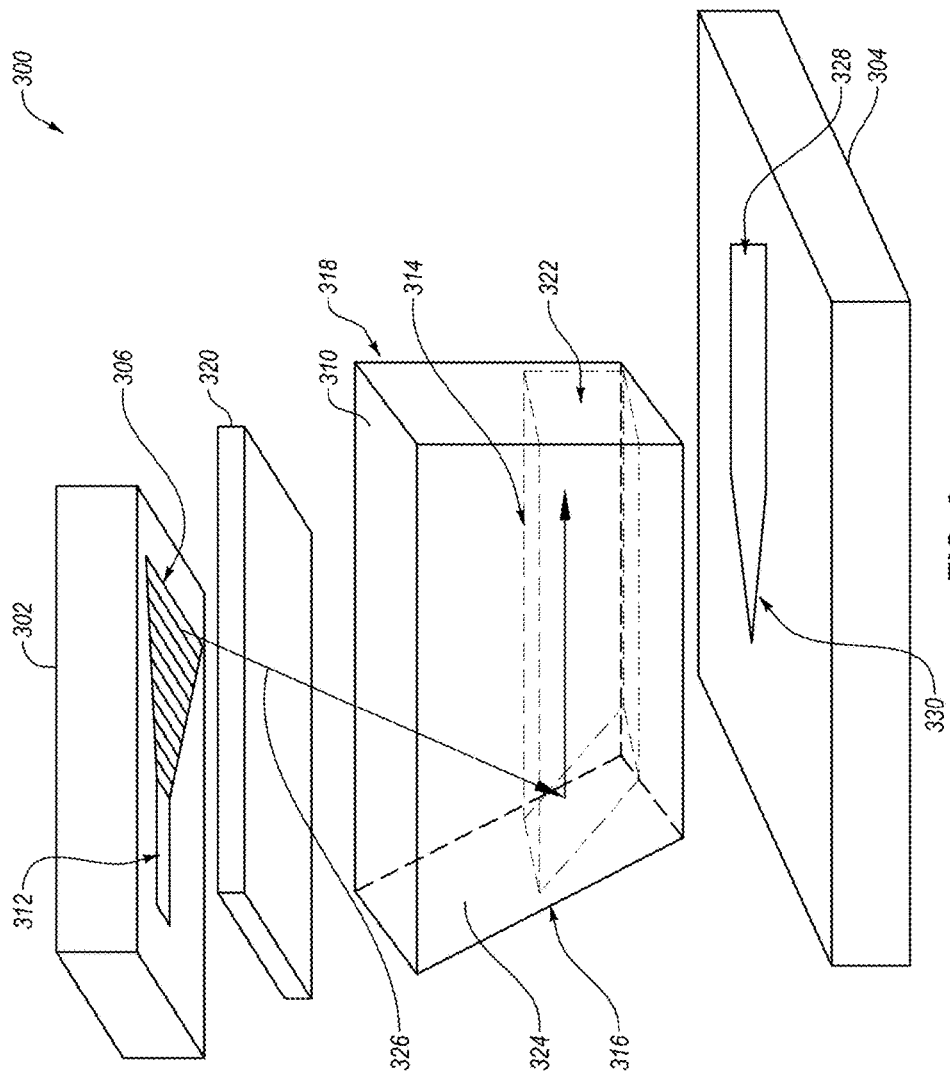

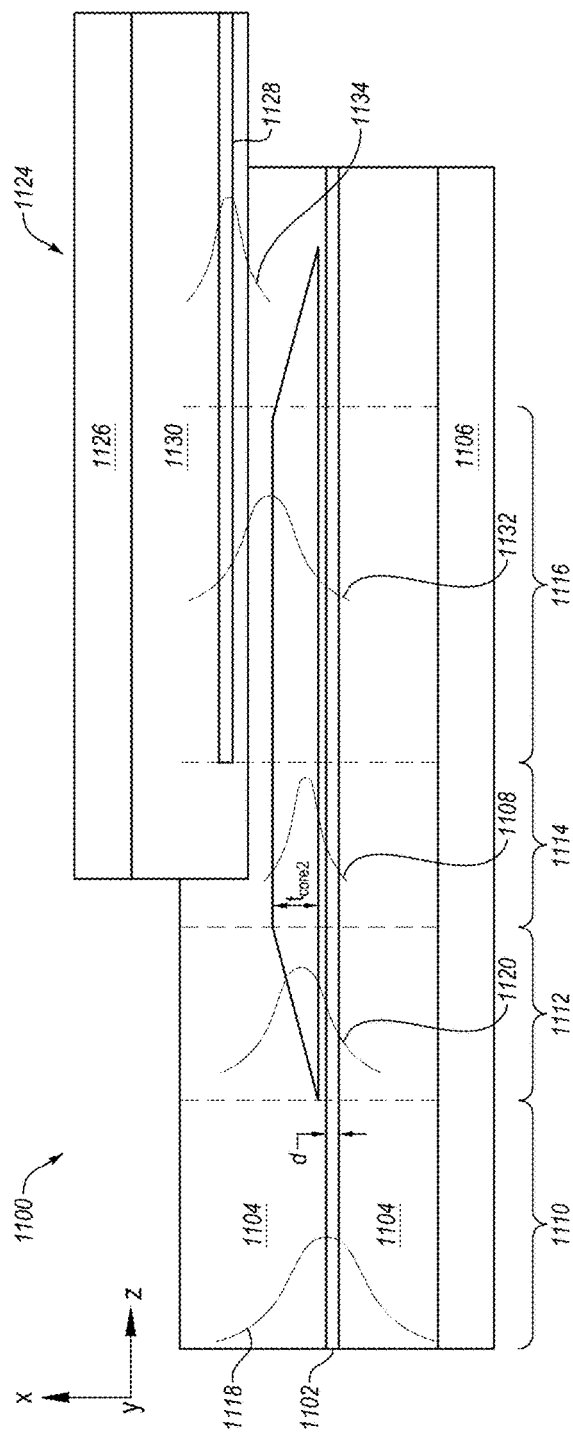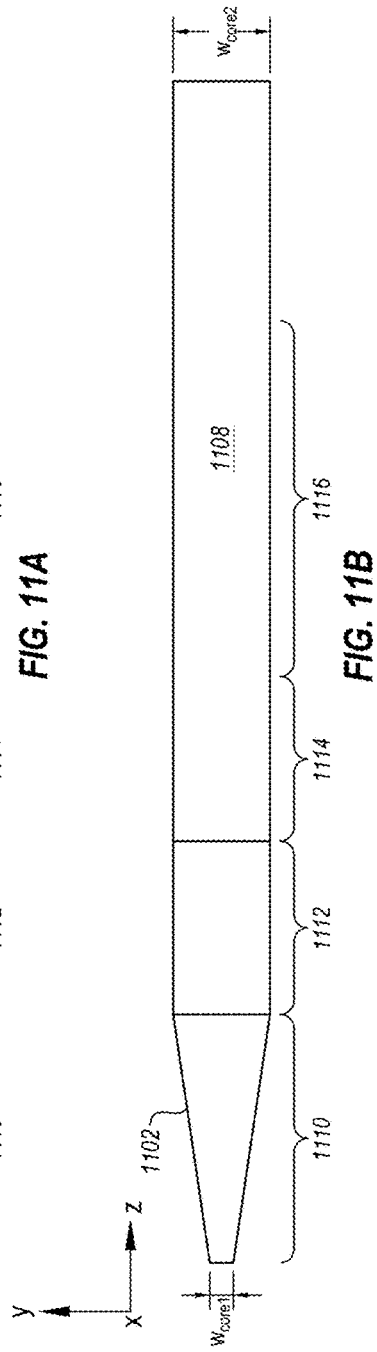
FIG. 11A
FIG. 11B

SURFACE COUPLED LASER AND LASER OPTICAL INTERPOSER

CROSS-REFERENCE TO RELATED APPLICATION

This application claims the benefit of and priority to U.S. Provisional App. No. 62/430,797, filed Dec. 6, 2016. The foregoing application is incorporated herein by reference.

FIELD

The embodiments discussed herein are related to surface coupled systems that include a surface coupled laser and a laser optical interposer (LOI).

BACKGROUND

Unless otherwise indicated herein, the materials described herein are not prior art to the claims in the present application and are not admitted to be prior art by inclusion in this section.

Coupling light from single mode edge emitting lasers to silicon (Si) photonics is costly, as it generally requires two lenses and a large isolator block. In systems that include such lasers and Si photonics, alignment tolerances may be less than 0.5 micrometers (μm). Such low alignment tolerances typically require active alignment to be met.

The subject matter claimed herein is not limited to implementations that solve any disadvantages or that operate only in environments such as those described above. Rather, this background is only provided to illustrate one example technology area where some implementations described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to surface coupled systems that include a surface coupled laser and a LOI.

In an example embodiment, a system includes a grating coupled laser, a LOI, an optical isolator, and a light redirector. The grating coupled laser includes a laser cavity and a transmit grating optically coupled to the laser cavity. The transmit grating is configured to diffract light emitted by the laser cavity out of the grating coupled laser. The LOI includes an LOI waveguide with an input end and an output end. The optical isolator is positioned between the surface coupled edge emitting laser and the LOI. The light redirector is positioned to redirect the light, after the light passes through the optical isolator, into the LOI waveguide of the LOI.

In another example embodiment, a method includes emitting light from an active section of a grating coupled laser. The method also includes diffracting the light out of the grating coupled laser at a transmit grating of the grating coupled laser. The method also includes passing the light through an optical isolator positioned in an optical path of the light. The method also includes redirecting the light to propagate in a horizontal direction into a LOI waveguide of a LOI. The method also includes receiving the light propagating horizontally into the LOI waveguide.

In an example embodiment, a system includes a grating coupled laser, a LOI, and a light redirector. The grating coupled laser includes a laser cavity and a transmit grating optically coupled to the laser cavity. The transmit grating is configured to diffract light emitted by the laser cavity out of the grating coupled laser. The LOI includes an LOI waveguide with an input end and an output end. The light redirector is optically positioned between the grating coupled laser and the LOI. The light redirector is configured to redirect the light received from the grating coupled laser and traveling in a first direction to travel in a second direction into the input end of the LOI waveguide, the second direction parallel to the LOI waveguide.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 3 illustrates another example surface coupled system that includes a LOI;

FIG. 11A includes a cross-sectional view of another example LOI;

FIG. 11B includes an overhead view of first and second waveguide cores of the LOI of FIG. 11A;

DETAILED DESCRIPTION OF SOME EXAMPLE EMBODIMENTS

Figure 1:
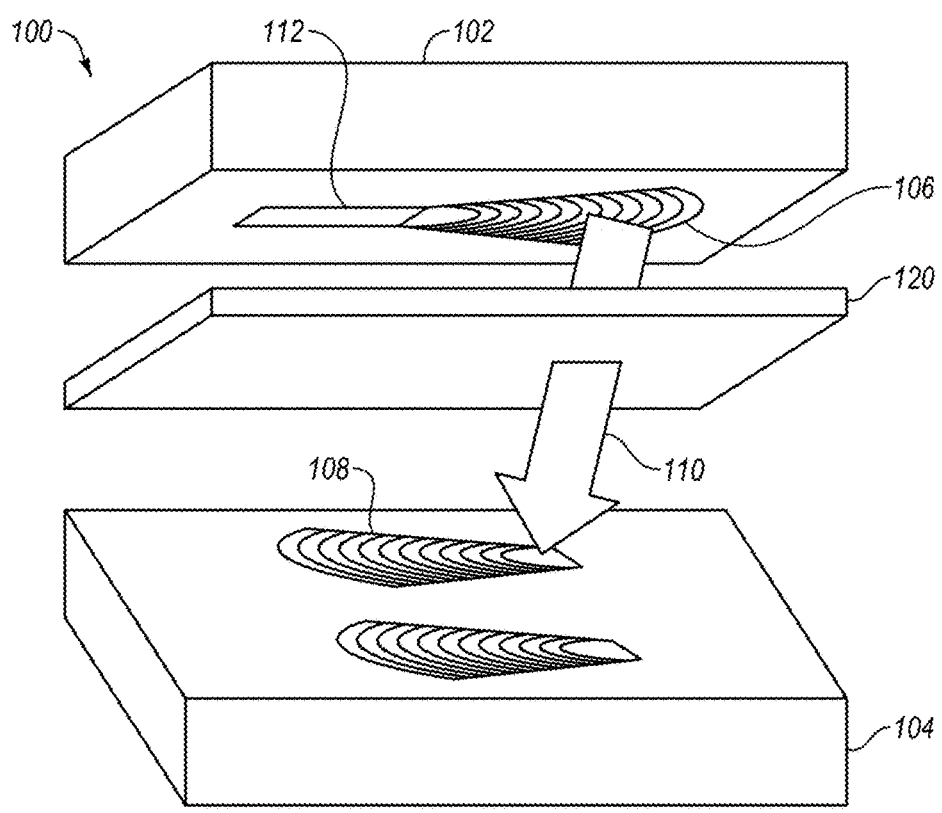
FIG. 1 illustrates an example surface coupled system.

U.S. Publication No. 2017/0179680, published Jun. 22, 2017 (hereinafter the '680 publication), and U.S. Pat. No. 9,405,066, issued Aug. 2, 2016 (hereinafter the '066 patent) are incorporated herein by reference.

Some embodiments described herein and/or in the '680 publication remove the need for lenses in systems such as those described in the BACKGROUND, which may reduce part count and cost, and significantly simplify packaging processes in such systems. An isolator may be used in such systems. The absence of lenses in such systems may significantly reduce the size and cost of the isolator and may significantly increase alignment tolerances. For example, the alignment tolerance may be increased by a factor of 10 or even 50 or more from about 0.1 μm which has to be done by active feed-back alignment, which requires turning on the laser during alignment, to about 1-2 μm or even 5-8 μm or more achieved in a passive alignment pick-and place machine; i.e. without having to turn on the laser. Alternatively or additionally, embodiments described herein may enable wafer level testing of lasers.

According to some embodiments disclosed in the '680 publication, a surface coupled system including a first surface grating (or first diffraction grating or transmit grating) and a second surface grating (or second diffraction grating or receive grating) is provided to couple light from an edge emitting laser to a PIC, such as a Si PIC. In some embodiments, the first and second surface gratings may each include a small index contrast long surface grating. In general, a small index contrast long surface grating may include a surface grating with an index contrast less than about 1-1.5 and a length greater than 10 μm. In other embodiments, the first and second surface gratings may each include a large area surface grating (LASG) with a length greater than about 10 μm and with or without small index contrast.

The edge emitting laser may include an indium phosphide (InP) laser or other suitable edge emitting laser. The InP laser may include an input passive waveguide that expands in a fan out region to the first surface grating. The first surface grating may be configured to generate a relatively large optical mode spot size of about 8-40 μm for an optical beam diffracted by the first surface grating. Such an edge emitting laser formed in the same chip with a transmit grating may be referred to herein as a surface coupled edge emitting laser.

According to embodiments described in the '680 publication, the receive grating may be formed in the Si PIC. The receive grating may be configured to receive the light diffracted by the transmit grating and to redirect the light into a waveguide of the Si PIC.

Embodiments described in the '680 publication additionally include aspects of the first diffraction grating. In an example embodiment, a surface coupled system may include a surface coupled edge emitting laser and a PIC. The surface coupled edge emitting laser may include a first waveguide and a first diffraction grating optically coupled to the first waveguide. The PIC may include a second waveguide and a second diffraction grating optically coupled to the second waveguide. The first waveguide of the surface coupled edge emitting laser may include a core with a core index of refraction, a top cladding with a top cladding index of refraction, and a substrate as a bottom cladding with a bottom cladding index of refraction. The first diffraction grating may include grating teeth formed on the core of the first waveguide, the grating teeth may each have a total height, a height above the core of the first waveguide, a period, and a duty cycle. The core index of refraction may be greater than a first threshold value so that an effective index of the first diffraction grating is sufficiently higher than the bottom cladding index to avoid leakage of a diffracted optical mode into the substrate.

The first surface grating mentioned above may alternatively or additionally be referred to as a first diffraction grating or a transmit grating. The second surface grating mentioned above may alternatively or additionally be referred to as a second diffraction grating or a receive grating. As used herein, "transmit grating" may generally refer to a diffraction grating included in a passive section of a surface coupled edge emitting laser which diffracts light from a laser cavity of the surface coupled edge emitting laser downward through a substrate and/or other layers towards the Si PIC. As used herein, "receive grating" may generally refer to a diffraction grating included in the Si PIC which receives the light from the transmit grating and directs it into a waveguide in the Si PIC.

Receive gratings in Si PICs may have coupling loss that is higher than desired for at least some applications. Alternatively or additionally, receive gratings may have insufficient bandwidth for some applications like coherent optics. Embodiments described herein include various alternatives to receive gratings.

In an example embodiment, a system includes a surface coupled edge emitting laser, a LOI, and an optical isolator. The surface coupled edge emitting laser includes a first waveguide and a transmit grating optically coupled to the first waveguide. The LOI includes a LOI waveguide and an input interface. The optical isolator is positioned between the surface coupled edge emitting laser and the LOI. The LOI is positioned to receive light output by the surface coupled edge emitting laser that is diffracted downward through the optical isolator by the transmit grating. The input interface of the laser optical interposer is configured to redirect the output beam into the LOI waveguide.

The system may additionally include a single mode fiber (SMF) butt-coupled to the LOI waveguide. In these and other embodiments, an optical mode of an input end of the LOI waveguide may match or substantially match an optical mode of the light output by the surface coupled edge emitting laser. Alternatively or additionally, an optical mode of an output end of the LOI waveguide may match or substantially match an optical mode of the SMF. Thus, the LOI may change the optical mode of the light from the input end to the output end. For instance, in an example embodiment, the input end of the LOI has a $w_0$ parameter in a range from 10 micrometers (μm) to 15 μm and the output end of the LOI has a $w_0$ parameter in a range from 4 μm to 5 μm. Two optical modes may be said to match if their profiles overlap by at least 70%, at 80%, at least 90%, or some other threshold.

In some embodiments, the system may include a PIC with a waveguide with a tapered end. The waveguide may include a silicon nitride (SiN) waveguide. The tapered end of the waveguide, and specifically of a waveguide core of the waveguide, in the PIC may be positioned beneath the output end of the LOI waveguide. The tapered end may be aligned in two orthogonal directions with the output end of the LOI waveguide. The LOI waveguide and the tapered end of the waveguide in the PIC may form an adiabatic coupler, e.g., as described in the '066 patent.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

FIG. 1 illustrates an example surface coupled system 100 as described in the '680 publication. As illustrated, the surface coupled system 100 may include a surface coupled edge emitting laser (hereinafter "laser") 102 and a Si PIC 104. Surface coupled edge emitting lasers such as illustrated in FIG. 1 and other Figures herein may alternatively or additionally be referred to as grating coupled lasers (GCLs) or GCL lasers. In the example of FIG. 1, the laser 102 includes an InP laser. The surface coupled system 100 of FIG. 1 may additionally include an optical isolator 120 disposed between the laser 102 and the Si PIC 104.

The laser 102 may include a first surface grating 106 and the Si PIC 104 may include a second surface grating 108. The first surface grating 106 may be optically coupled to an active section 112 of the laser 102 through a core waveguide. The core waveguide may be optically coupled to receive light emitted by a gain medium (not illustrated) of the active section 112 of the laser 102. In some embodiments, a fan out region may be provided between the core waveguide and the first surface grating 106 and/or may include the core waveguide. The fan out region may be formed from a same medium and layer as the core waveguide such that the fan out region may generally be an extension of the core waveguide. Additionally, the fan out region may include grating lines such that the fan out region may generally be an extension of the first surface grating 106.

The light emitted from the active section 112 of the laser 102 may travel through the core waveguide to the fan out region, where a mode of the light may be expanded laterally (e.g., generally in and out of the page in FIG. 1). The first surface grating 106 may diffract the light with the laterally expanded mode generally downward as diffracted light 110. The diffracted light 110 may be diffracted toward the second surface grating 108 of the Si PIC 104. The mode of the diffracted light 110 may be expanded to a 8-40 μm spot size (lateral measurement) within the fan out region while simultaneously being expanded along the direction of the active section 112 by the first surface grating 106. One potential benefit of this method of expanding diffracted light may be that the spot size may be much larger than the 2 to 4 μm spot size that can be achieved with standard spot size converters.

The diffracted light 110 may be received by the second surface grating 108. The diffracted light 110 may be redirected by the second surface grating 108 into a waveguide (not illustrated) of the Si PIC 104. One example of the waveguide may be a Si waveguide.

The diffracted light 110 passes through the optical isolator 120 before reaching the second surface grating 108 of the Si PIC 104. The optical isolator 120 may be configured to reduce or eliminate back reflection. The optical isolator 120 may be attached to the Si PIC 104, or to the laser 102, or to both the Si PIC 104 and the laser 102.

Figure 2A:
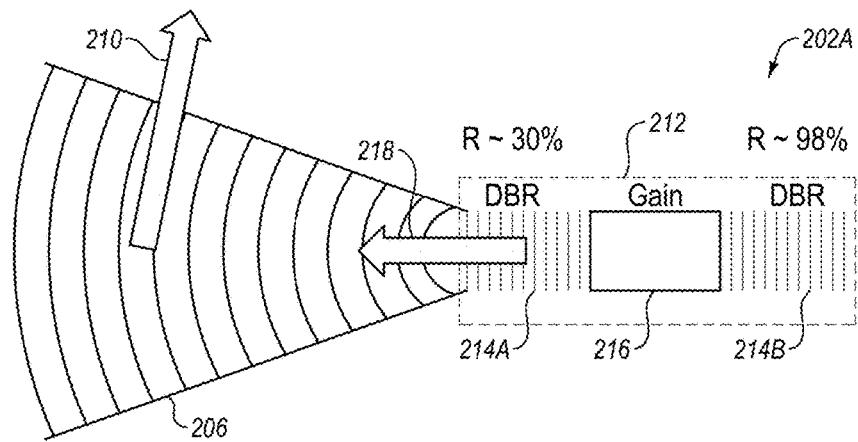
FIGS. 2A and 2B illustrate an example surface coupled edge emitting laser that may be implemented in a surface coupled system.
Figure 2B:
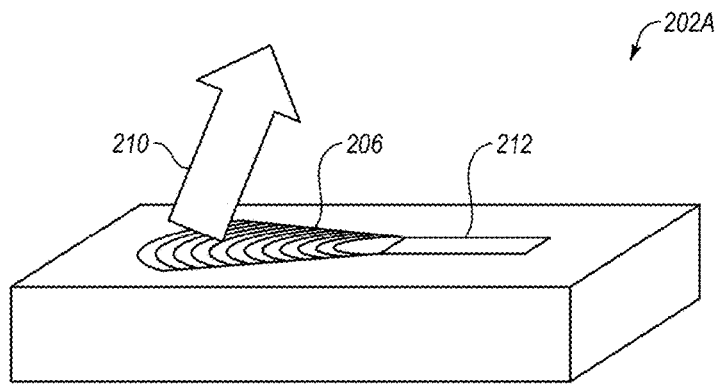
Figure 2C:
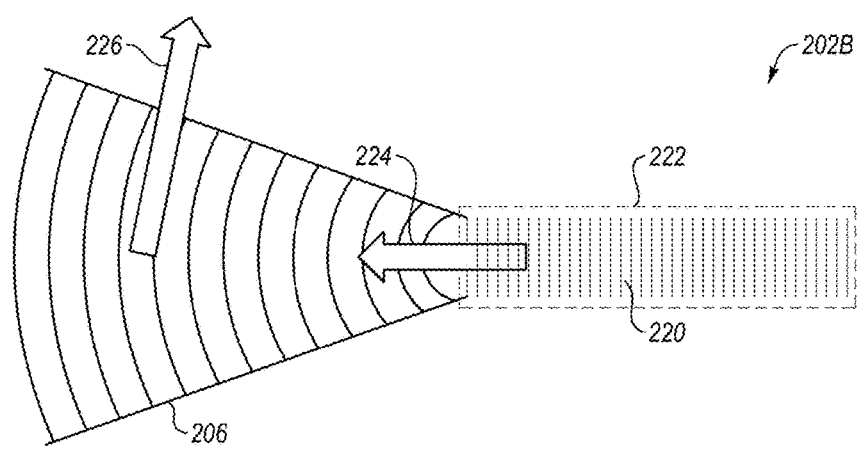
FIG. 2C illustrates another example surface coupled edge emitting laser that may be implemented in a surface coupled system.

FIGS. 2A and 2B illustrate an example surface coupled edge emitting laser (hereinafter "laser") 202A that may be implemented in a surface coupled system, such as the surface coupled system 100 discussed in relation to FIG. 1 and in the surface coupled system 300 of FIG. 3 and in other surface coupled systems described herein. FIG. 2A includes a bottom view and FIG. 2B includes a bottom perspective view of the laser 202A. FIG. 2C illustrates another example surface coupled edge emitting laser (hereinafter "laser") 202B that may be implemented in a surface coupled system, such as the surface coupled system 100 discussed in relation to FIG. 1, the surface coupled system 300 of FIG. 3, or other surface coupled systems described herein. Each of the lasers 202A and 202B may include or correspond to the laser 102 of FIG. 1 or to other lasers in other systems described herein.

Referring first to FIGS. 2A and 2B, the laser 202A may include a gain medium 216, a first distributed Bragg reflector (DBR) 214A, and a second DBR 214B. The first and second DBRs 214A-B together with the gain medium 216 may form a laser cavity 212 such that the laser 202A in the example of FIGS. 2A and 2B may include a DBR laser. Alternatively or additionally, and as illustrated in FIG. 2C, the laser 202B may include a distributed feedback (DFB) laser in which a grating 220 and gain medium 222 overlap in the laser cavity. In other embodiments, a DFB type gain region and one or more passive DBR regions may both be present to provide feedback in a configuration which may be termed a Distributed Reflector (DR) laser, and which may be used for high speed laser applications. Each of the lasers 202A, 202B may include a first surface grating 206 optically coupled to the corresponding laser cavity (e.g., 212 in FIGS. 2A and 2B). The first surface grating 206 may be similar or identical to the first surface grating 106 discussed in relation to FIG. 1 or to other first surface gratings discussed herein. A fan out region of the first surface grating 206 may include grating lines such that the first surface grating 206 and the fan out region partially or completely overlap.

In FIGS. 2A and 2B, a reflectance of the second DBR 214B may be about 98 percent and a reflectance of the first DBR 214A may be about 30 percent. In other embodiments, the first and second DBRs 214A-B may have other reflectance values.

The laser 202A may generally emit light 218 through the first DBR 214A toward the first surface grating 206. The emitted light 218 may interact with the first surface grating 206 to be diffracted by the first surface grating 206 as diffracted light 210.

In FIG. 2C, the laser 202B implemented as a DFB laser may generally emit light 224 through a front of the DFB laser toward the first surface grating 206. The light 224 may interact with the first surface grating 206 to be diffracted by the first surface grating 206 as diffracted light 226.

The laser 202A and/or 202B may be hermetically sealed by a passivation layer formed by SiN or silicon oxide ($SiO_x$) deposition on the laser 202A or 202B. In more detail, one or more layers of SiN and/or $SiO_x$ may be deposited over the laser 202A or 202B to hermetically seal the laser 202A or 202B.

The surface coupled system 100 of FIG. 1 is an example of a relatively simple integration scheme for coupling light from the laser 102 to the Si PIC 104. However, some implementations of the configuration of FIG. 1 may be subject to undesirably high coupling loss, limited bandwidth, and/or back reflection. Embodiments described herein relate to an alternative coupling scheme to couple light from a GCL laser to a Si PIC that may have lower loss, wider bandwidth, and/or less back reflection than the configuration of FIG. 1.

Accordingly, FIG. 3 illustrates another example surface coupled system 300, arranged in accordance with at least one embodiment described herein. As illustrated, the surface coupled system 300 may include a GCL laser 302, a LOI 310, an optical isolator 320, and a Si PIC 304. The GCL laser 302 and the optical isolator 320 may be the same or similar to the other lasers and optical isolators described herein and/or in the '680 publication. For instance, the GCL laser 302 may include an active section/laser cavity 312 and first surface grating 306 similar to the laser 102 of FIG. 1 and may function in the same or similar way, while the optical isolator 320 may function in the same or similar way as the optical isolator 120.

The LOI 310 includes an LOI waveguide 314 and an input interface 316 (labeled "Reflecting interface" in FIG. 3). The LOI 310 may additionally include an exit facet 318. The LOI waveguide 314 may include a waveguide core 322 and a cladding 324. The waveguide core 322 may include SiN and the cladding 324 may include silicon dioxide ($SiO_2$) in some embodiments. In other embodiments, the LOI 310 may include a high index glass waveguide formed by ion exchange process.

In operation, light 326 is output generally downward from the GCL laser 302, and more particularly at an angle $\phi$ relative to a normal line from the GCL laser 302, which normal line may be vertical assuming the GCL laser 302 is positioned with the first surface grating 306 parallel to horizontal. The light 326 passes through the optical interposer 320 and a top of the LOI 310 and interacts with the input interface 316 of the LOI 310. Assuming the LOI 310 is positioned with its upper and lower surfaces parallel to horizontal, the input interface 316 may be angled relative to vertical at an interface angle $\theta$ selected to redirect the light into the LOI waveguide 314 traveling horizontal. The input interface 316 may redirect the light by reflection, e.g., total internal reflection.

The waveguide core 322 of the LOI waveguide 314 may have a higher index of refraction than the cladding 324 of the LOI waveguide 314. The LOI 310 may be surrounded by air or other surrounding material of lower index of refraction than the cladding 324 of the LOI waveguide 314 to cause the light 326 from the GCL laser 302 that reaches the input interface 316 to reflect in the horizontal direction into the waveguide core 322 of the LOI waveguide 314.

The Si PIC 304 includes a waveguide 328 with a tapered end 330. The waveguide 328 of the Si PIC 304 may include a SiN waveguide, e.g., a SiN waveguide core surrounded by cladding. Discussion of tapering or a tapered end of this and other waveguides may more particularly refer to tapering or a tapered end of the waveguide core unless context indicates otherwise.

The tapered end 330 of the waveguide 328 in the Si PIC may be positioned beneath an output end of the LOI waveguide 314. The tapered end 330 may be aligned in two orthogonal directions with the output end of the LOI waveguide 314. The LOI waveguide 314 and the tapered end 330 of the waveguide 328 in the Si PIC 304 may form an adiabatic coupler, e.g., as described in the '066 patent. In these and other embodiments, taper width and shape of the tapered end 330 of the waveguide 328 in the Si PIC 304 may be designed such that at some point along the length of the tapered end 330, effective index of the optical mode in the LOI waveguide 314 substantially matches effective index of the tapered end 330 of the waveguide 328. As such, the light traveling in the LOI waveguide 314 may be adiabatically coupled from the LOI waveguide 314 into the waveguide 328 in the Si PIC 304.

Figure 4:
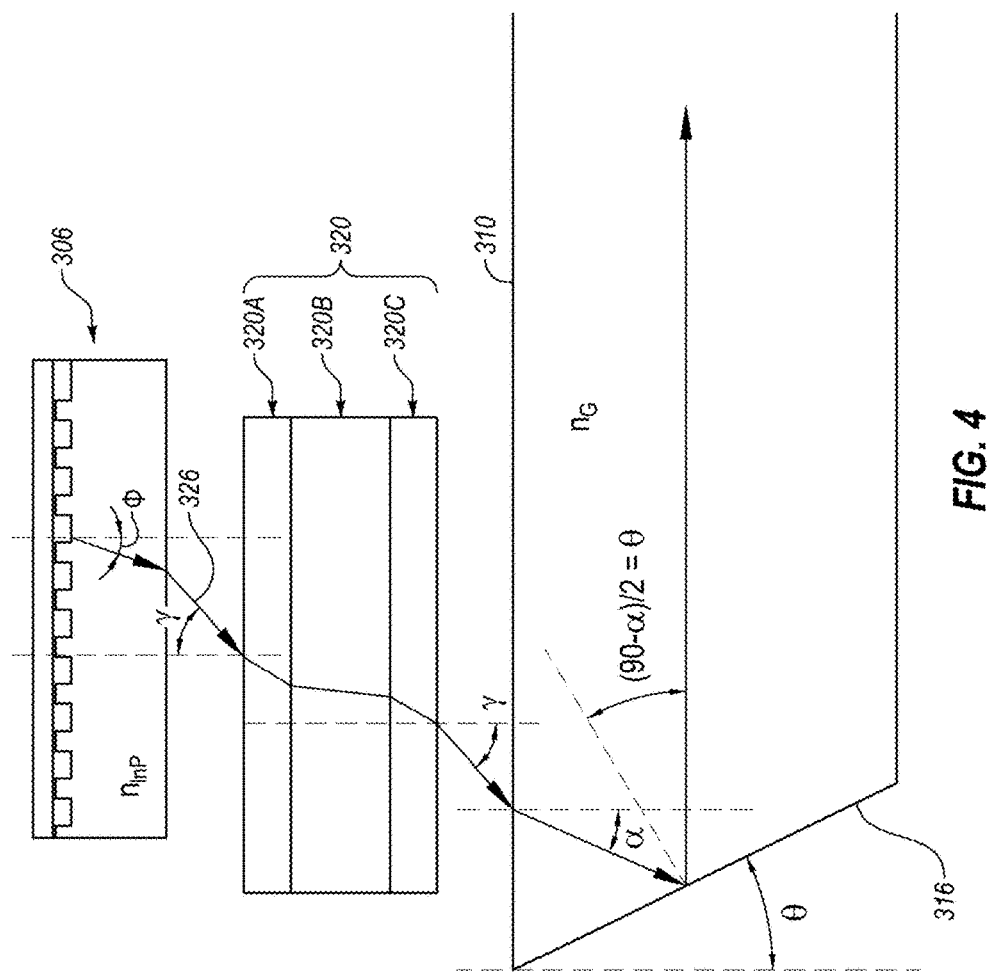
FIG. 4 illustrates derivation of an interface angle θ of an input interface of the LOI of FIG. 3.

Equations (1)-(4) together with FIG. 4 illustrate derivation of the interface angle $\theta$ of the input interface 316 of the LOI 310 of FIG. 3, arranged in accordance with at least one embodiment described herein.

$$\sin(\gamma) = n_{InP}\sin(\varphi) \qquad (1)$$

$$\sin(\alpha) = \sin(\gamma)/n_G \qquad (2)$$

$$\theta = (90 - \alpha)/2 \qquad (3)$$

$$\theta = 45 - \frac{1}{2}\sin^{-1}\left(\frac{n_{InP}\sin(\varphi)}{n_G}\right) \qquad (4)$$

In FIG. 4 and equations (1)-(4), and assuming the first surface grating 306, the optical isolator 320, and the LOI 310 are all oriented parallel to horizontal, $\varphi$ is the diffraction angle of the light 326 from the first surface grating 306, $\gamma$ is both the angle of incidence of the light 326 at the optical isolator 320 and the angle of departure of the light 326 from the optical isolator 320, $\alpha$ is the propagation angle of the light 326 through the LOI 310 relative to vertical, $\theta$ is the interface angle of the input interface 316, $n_{InP}$ is the index of refraction of a substrate of the GCL laser through which the light 326 passes, and $n_G$ is the index of refraction of the LOI 310, or at least of the cladding of the LOI 310.

In an example embodiment, and as illustrated in FIG. 4, the optical isolator 320 may include a first polarizer 320A, a Garnet or other Faraday Rotator 320B, and a second polarizer 320C.

From Snell's law, the interface angle $\theta$ of the input interface 316 of the LOI 310 is given from equations (1)-(3) by equation (4). As an example, if the index of refraction $n_{InP}$ is 3.25 and the index of refraction $n_G$ of the LOI 310 is 1.467, then the diffraction angle $\varphi$ from the transmit grating may be about 14 degrees and the interface angle $\theta$ of the input interface 316 of the LOI 310 may be about 28.5 degrees. In some embodiments, the indices of refraction of the first polarizer 320A, the Garnet 320B, and the second polarizer 320C that make up the optical isolator 320 may be irrelevant to the derivation of the interface angle $\theta$ as long as the surfaces of each are parallel to each other. In this and other embodiments, the angle $\gamma$ at the input and the output of the optical isolator 320 may remain the same, only the position at which the light 326 enters and exits the optical isolator 320 may change. More generally, however, the angle(s) at which light enters and exits the optical isolator 320 may be considered if surfaces of the optical isolator 320 are not parallel to each other.

Figure 5:
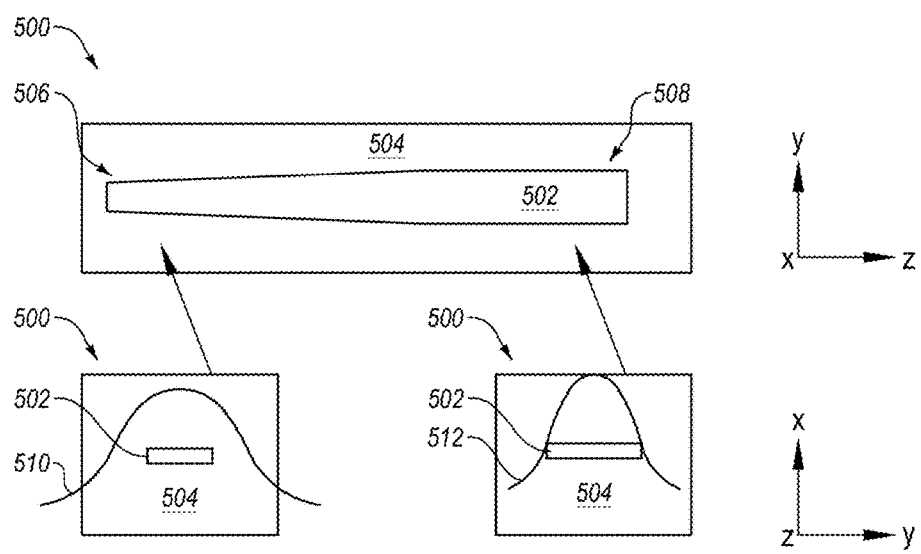
FIG. 5 illustrates an overhead view and cross-sectional views of an example LOI.

FIG. 5 illustrates an overhead view and cross-sectional views of an example LOI 500, arranged in accordance with at least one embodiment described herein. The LOI 500 may include or correspond to the LOI 310 of FIGS. 3 and 4 or to other LOIs in other surface coupled systems described herein. FIG. 5 and other Figures herein include an arbitrarily-defined x-y-z reference frame. In the x-y-z reference frame, the x axis is oriented vertically, the y axis is oriented laterally, and the z axis is oriented in a light propagation direction.

In the example of FIG. 5, the LOI 500 includes a waveguide core 502 and surrounding cladding 504 that together form an LOI waveguide of the LOI 500. As illustrated in the overhead view of FIG. 5 (top diagram), the waveguide core 502 includes an input end 506 that is tapered, and an output end 508 that may or may not be tapered. The input end 506 and/or the output end 508, to the extent tapered, may be tapered in a single dimension, e.g., laterally (y direction) or vertically (x direction), or in two dimensions, e.g., laterally and vertically. In the example of FIG. 5, the input end 506 is tapered in the lateral direction and is narrowest at a leftmost point of the input end 506, the input end 506 widening from left to right in FIG. 5. The two cross-sectional views of FIG. 5 depict example widths of the waveguide core 502 at the leftmost point of the waveguide core 502 in the cross-sectional view on the left and at the rightmost point of the waveguide core 502 in the cross-sectional view on the right.

Each of the cross-sectional views of FIG. 5 additionally illustrates a corresponding example optical mode 510, 512 of the LOI 500 at the input end 506 and the output end 508. Each of the optical modes 510, 512 is generally Gaussian and may be characterized by a parameter $w_0$. The parameter $w_0$ may refer to half the width of the Gaussian optical mode intensity at $1/e^2$ of its peak height. In general, the optical mode may be less confined with smaller waveguide core. Thus, the optical mode may be less confined at the input end 506 and more confined at the output end 508 of the waveguide core 502 of the LOI waveguide. As an example, the $w_0$ parameter of the optical mode 510 at the input end 506 may be in a range from 10-15 μm, while the $w_0$ parameter of the optical mode 512 at the output end 508 may be in a range from 4-5 μm. More generally, the LOI waveguide may be configured so that the input end 506 has an optical mode 510 that substantially matches an optical mode of the light output from a corresponding GCL laser and so that the output end 508 has an optical mode 512 that substantially matches an optical mode of a waveguide of a Si PIC (e.g., the waveguide 328 of the Si PIC 304 of FIG. 3) or of a SMF.

Figure 6:
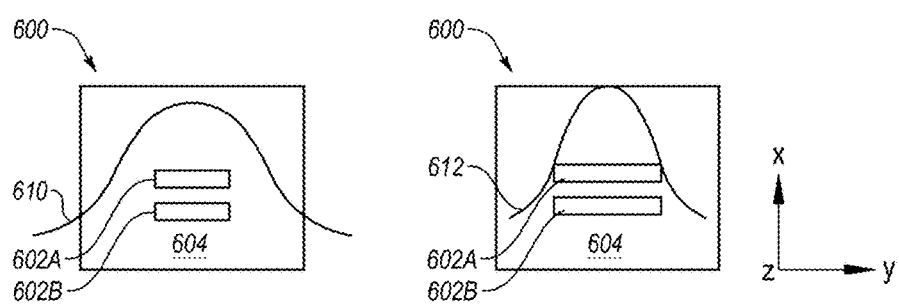
FIG. 6 illustrates cross-sectional views of an example LOI with two vertically separated and parallel waveguide cores.

In the cross-sectional views of FIG. 5, the LOI waveguide includes a single waveguide core 502. In other embodiments, the LOI waveguide may include two or more waveguide cores, which together form an effective single mode waveguide. Examples of such LOI waveguides have been disclosed by LIONIX BV. The two or more waveguide cores may include the same or different footprints. For example, FIG. 6 illustrates cross-sectional views of an example LOI 600 with two vertically separated and parallel waveguide cores 602A, 602B (hereinafter collectively "waveguide cores 602"), arranged in accordance with at least one embodiment described herein. The left-most cross-sectional view of the LOI 600 may be of an input end of the LOI 600 while the right-most cross-sectional view of the LOI 600 may be of an output end of the LOI 600. In the example of FIG. 6, the two waveguide cores 602 have the same footprint as each other and may have the same or similar footprint as the waveguide core 502 as illustrated in the overhead view of FIG. 5. For example, each of the two waveguide cores 602 in FIG. 6 may be relatively narrower at the input end as illustrated in the leftmost cross-sectional view of FIG. 6 tapering output to be relatively wider at the output end as illustrated in the rightmost cross-sectional view of FIG. 6.

Each of the cross-sectional views of FIG. 6 additionally illustrates a corresponding example optical mode 610, 612 of the LOI 600 at, respectively, the input end and at the output end of the LOI 600. As in FIG. 5, the optical mode 610 may be less confined at the input end whereas the optical mode 612 may be more confined at the output end of the waveguide cores 602 of the LOI 600.

A variety of configurations can be used to achieve the desired waveguide properties for the LOI waveguide of one or more of the LOIs described herein. In an example, the LOI waveguide includes one or more SiN waveguide cores with silicon dioxide ($SiO_2$) cladding. Each of the one or more SiN waveguide cores may have thin rectangular cross-sectional profiles as illustrated in FIGS. 5 and 6, with thicknesses (e.g., in the vertical direction) of 200-300 nanometers (nm) and varying widths for the taper and that are single mode for TE polarization. By tapering the width (e.g., the y dimension) of the one or more waveguide cores, the optical mode may be modified to match $w_0$=10-15 μm on the entrance of the LOI waveguide to match the mode out of a transmit grating of a GCL laser, and optionally to match a SMF at the exit facet of the LOI. The same or similar configuration can be used to adiabatically couple light from the LOI waveguide to a SiN waveguide with a tapered end in a Si PIC, e.g., as illustrated in FIG. 3.

Figure 7:
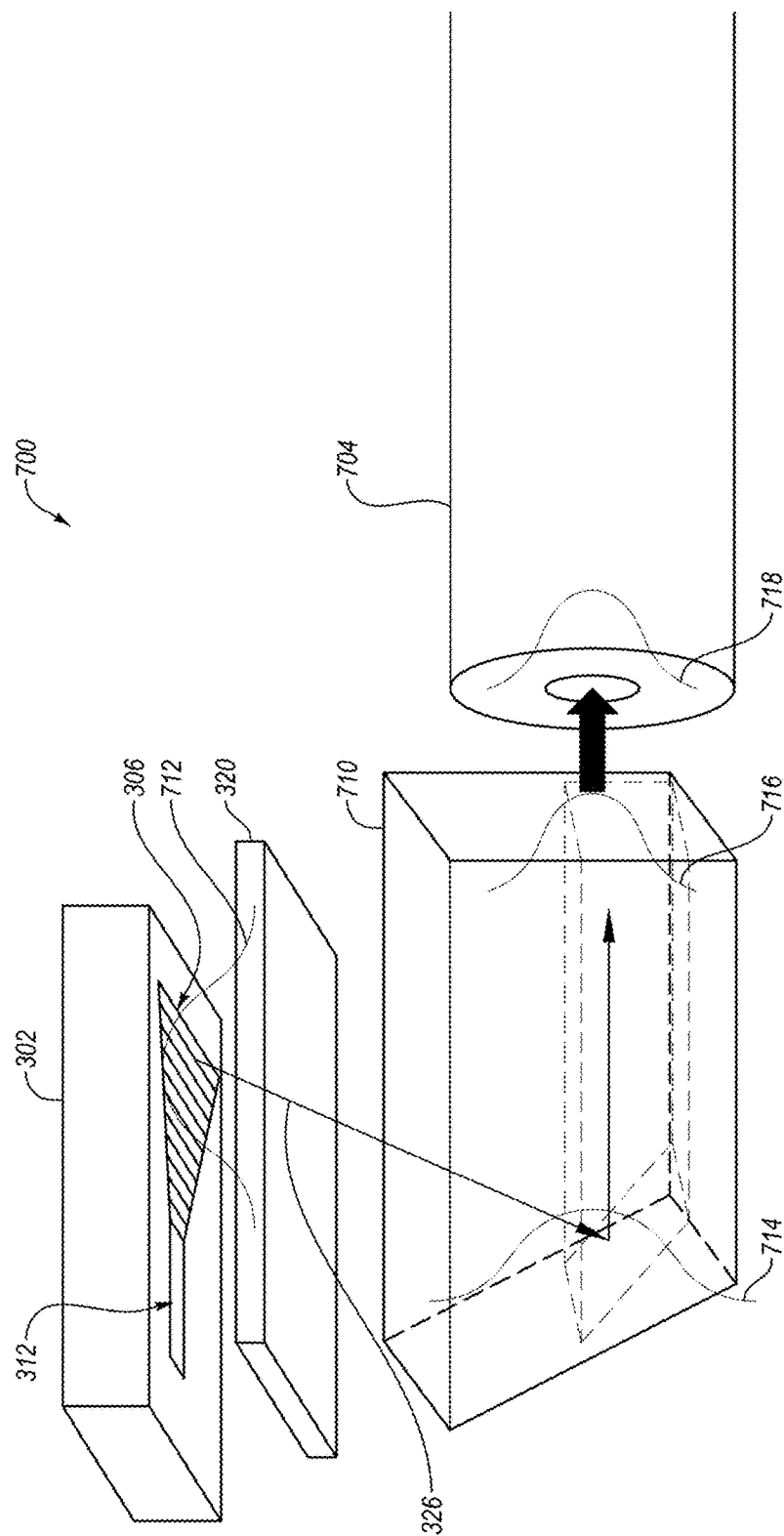
FIG. 7 illustrates another example surface coupled system.

FIG. 7 illustrates another example surface coupled system 700, arranged in accordance with at least one embodiment described herein. The surface coupled system 700 of FIG. 7 includes the GCL laser 302 and the optical isolator 320 of FIG. 3. The surface coupled system of FIG. 7 additionally includes an LOI 710 and a SMF 704 instead of the Si PIC 304 of FIG. 3. The LOI 710 may be the same as or similar to the LOIs 310, 500, 600 of FIGS. 3-6 provided an optical mode at the output of the LOI 710 is configured to match an optical mode of the SMF 704.

FIG. 7 additionally includes example optical modes 712, 714, 716, 718 of the light 326 generated by the GCL laser 302 at various points in the surface coupled system 700 of FIG. 7. As illustrated in FIG. 7, the optical mode 714 at an input end (e.g., left side) of the LOI 710 substantially matches the optical mode 712 output from the first surface grating 306, while the optical mode 716 at an output end (e.g., the right side) of the LOI 710 substantially matches the optical mode 718 of the SMF 704.

In the example of FIG. 7, the output of the LOI 710 may be directly butt-coupled to the SMF 704. The GCL laser 302 may be a high speed directly modulated laser (DML), in which case the Si PIC (e.g., the Si PIC 304 of FIG. 3) may be omitted and the light 326 in the form of an optical signal may be directly generated in the GCL laser 302 and output to the SMF 704 through the optical isolator 320 and the LOI 710. With reference to FIG. 3, where the GCL laser 302 is not a DML, however, the light 326 may be generated by the GCL laser 302 as an optical beam that is output through the optical isolator 320 and the LOI 310 into the Si PIC 304, which may include an external modulator to convert the optical beam to an optical signal.

Returning to FIG. 7, the first surface grating 306 in the GCL laser 302, which may include an InP laser, may function as a very large spot size converter, generating a spot size of 10-20 μm full width at half maximum (or a divergence angle of ~1 degree) not achievable by standard tapering in InP. Typical divergence angle for conventional DMLs may be roughly 10-20 times higher than the example embodiment of FIG. 7. The large spot and small divergence according to embodiments described herein allow the optical isolator 320 to be packaged without critical alignment due to an alignment accuracy of 5-8 μm. Here, the LOI 710 may convert the mode size down to match that of the SMF 704.

The embodiment of FIG. 7 may functionally include a telescope without lenses or critical alignment. The large spot size decreases the tolerance on angle of incidence including variation of the interface angle θ, so it may be taken into account in optimization of the surface coupled system 700 of FIG. 7.

Figure 8:
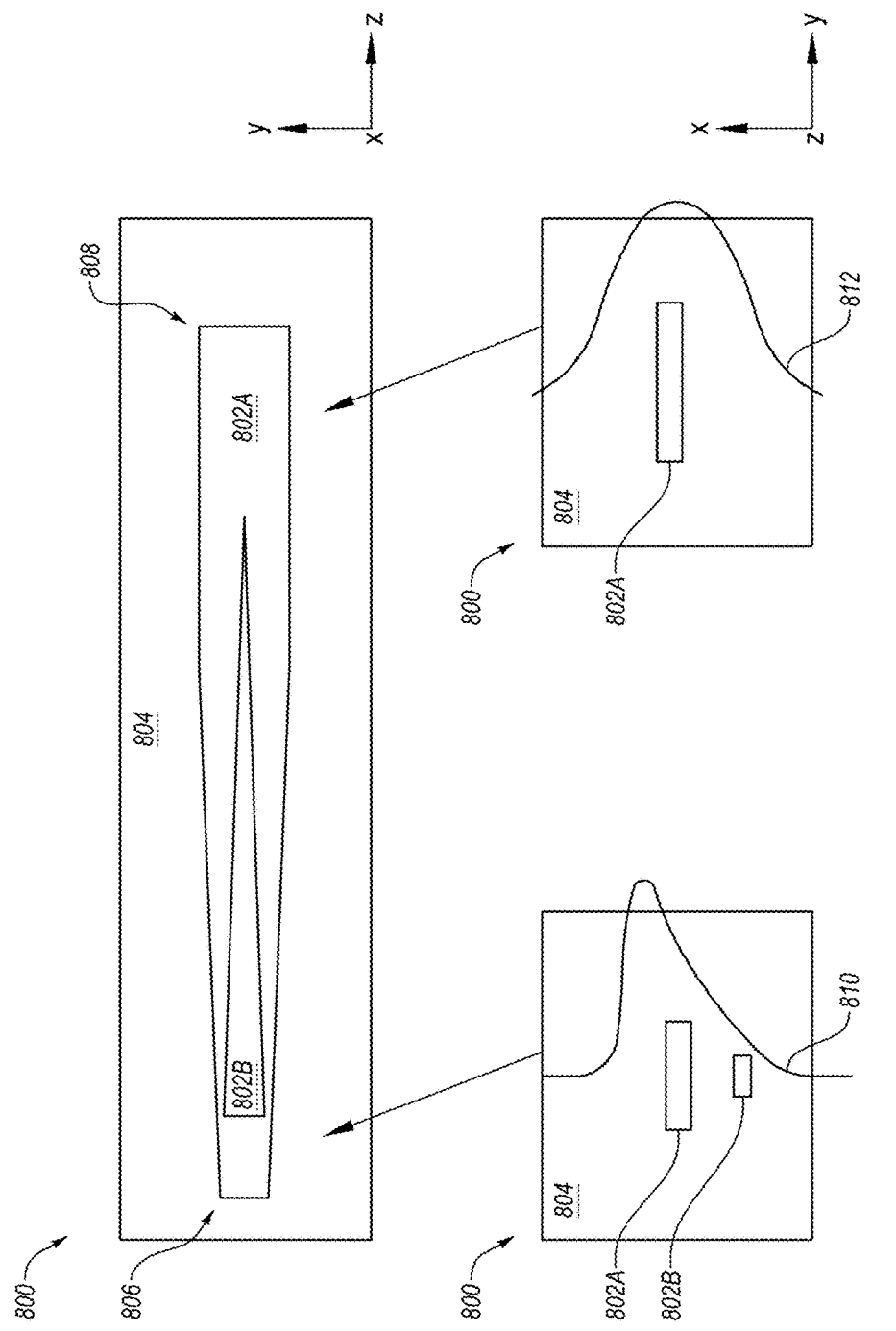
FIG. 8 illustrates an overhead view and cross-sectional views of another example LOI.

FIG. 8 illustrates an overhead view and cross-sectional views of another example LOI 800, arranged in accordance with at least one embodiment described herein. The LOI 800 may include or correspond to the LOI 310 of FIGS. 3 and 4, or to the LOI 710 of FIG. 7, or to other LOIs in other surface coupled systems described herein.

In the example of FIG. 8, the LOI 800 includes two waveguide cores 802A, 802B (collectively "waveguide cores 802") and surrounding cladding 804 that together form the LOI waveguide of the LOI 800. The two waveguide cores 802 may include both a SiN waveguide core 802A and a Si waveguide core 802B aligned to overlap both laterally (e.g., in the y direction) and longitudinally (e.g., in the z direction). The SiN waveguide core 802A may be tapered, e.g., relatively narrow at an input end 806 of the LOI waveguide and widening from left to right along at least a portion of the length of the SiN waveguide core 802A to be relatively wider at an output end 808 of the LOI waveguide, similar to the waveguide core 502 of FIG. 5. The Si waveguide core 802B may also be tapered, narrowing from left to right, and may be completely absent at the output end 808 of the LOI waveguide.

The two cross-sectional views include the cross-sectional view on the left, taken near the input end 806 where the waveguide cores 802 overlap in the y and z directions, and the cross-sectional view on the right, taken near the output end 808 where the Si waveguide core 802B is absent. Each of the cross-sectional views includes a representation of the optical mode 810, 812 at the corresponding location.

The optical mode out of a transmit grating (or first surface grating) of a corresponding GCL laser may be exponential in intensity profile if the transmit grating is not apodized. In these and other embodiments, the Si waveguide core 802B may be provided beneath the SiN waveguide core 802A in the LOI 800 to modify the optical mode to better overlap with the optical mode of the transmit grating. The Si waveguide core 802B may be located about 100 nm beneath the SiN waveguide core 802A in some embodiments.

As indicated above, some embodiments described herein may have lower loss, wider bandwidth, and/or less back reflection than the configuration of FIG. 1. For example, some embodiments of LOIs as described herein may have loss lower than 1 decibel (dB) and a bandwidth of about 100 nanometers or more. In these and other embodiments, the LOI may be designed to accept about a 30 µm Gaussian optical mode from a GCL laser. The 30 µm Gaussian optical mode may be equivalent to a Gaussian optical mode with a $w_0$ parameter of 15 µm. The LOI may include a low-contrast oxide waveguide with a tapered SiN waveguide core that has a relatively thin/narrow tip. The LOI may also include a spot size converter (SSC) section that transitions from the low-contrast waveguide to a high-contrast waveguide. The LOI may include or be coupled to an angled facet, such as the input interface 316 of FIG. 3, to direct light into the LOI waveguide.

Figure 9:
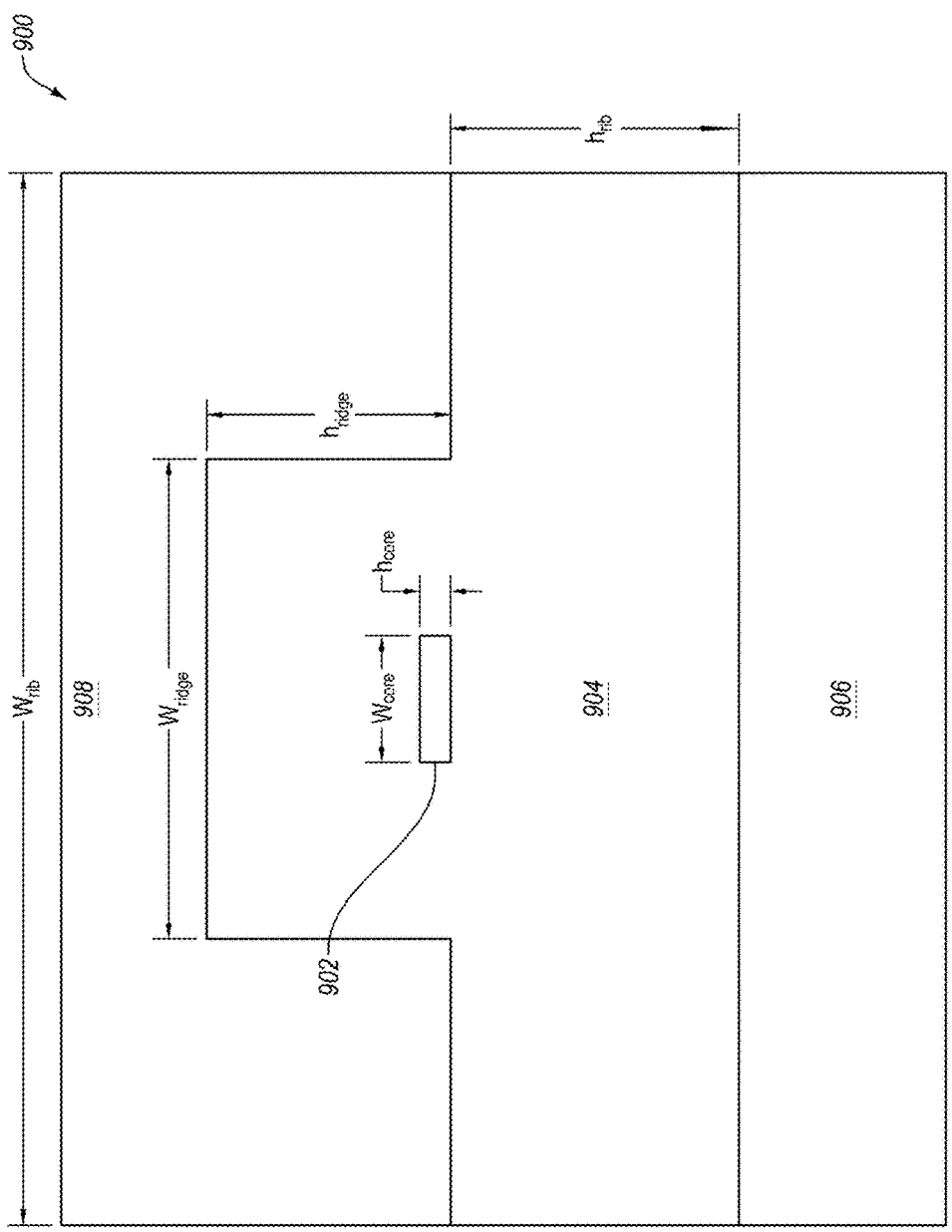
FIG. 9 is a cross-sectional view of another example LOI.

FIG. 9 is a cross-sectional view of another example LOI 900, arranged in accordance with at least one embodiment described herein. The LOI 900 may include or correspond to one or more of the other LOIs described herein. The LOI 900 may include a waveguide core 902, a cladding 904, and a substrate 906. Alternatively or additionally, the LOI 900 may include an air cladding 908.

The waveguide core 902 may include SiN or other suitable material. The waveguide core 902 may have a width $w_{core}$ and a height $h_{core}$ which may be constant or variable along a length (e.g., coming in and out of the page) of the waveguide core 902. For instance, the waveguide core 902 maybe tapered in width, similar to the waveguide cores discussed above, or in height. Alternatively or additionally, the LOI 900 may include additional waveguide cores above or below the waveguide core 902 along at least some portions of the length of the LOI 900. In an example embodiment, and at a location of the cross-sectional view of FIG. 9, the width $w_{core}$ may be about 0.5 µm and the height $h_{core}$ may be about 25 nm.

The cladding 904 may include $SiO_2$ or other suitable material. The cladding 904 may have a rib-type cross-sectional profile with a ridge width $w_{ridge}$, a ridge height $h_{ridge}$, a rib height him, and a rib width $w_{rib}$. In an example embodiment, and at the location of the cross-sectional view of FIG. 9, the ridge width $w_{ridge}$ may be about 35 µm, the ridge height $h_{ridge}$ may be about 13 µm, the rib height him may be about 20 µm, and the rib width writ may be about 30 µm. One or more of the other LOIs described herein may similarly be implemented with a cladding that has a rib-type cross-sectional profile.

The substrate 906 may include Si or other suitable material. One or more of the other LOIs described herein may similarly be implemented with a substrate.

The air cladding 908 may help to lower guiding mode effective index, leading to a larger mode profile. One or more of the other LOIs described herein may similarly be implemented with an air cladding.

The LOI 900 may be optimized or configured for single-polarization operation. For example, the LOI 900 may have an input optical mode (e.g., an optical mode at its input end) that matches or substantially matches an output optical mode of a GCL laser for TE polarized light and may modify the optical mode to match, at an output of the LOI 900, an input optical mode of a SMF or Si PIC for the TE polarized light.

Figure 10:
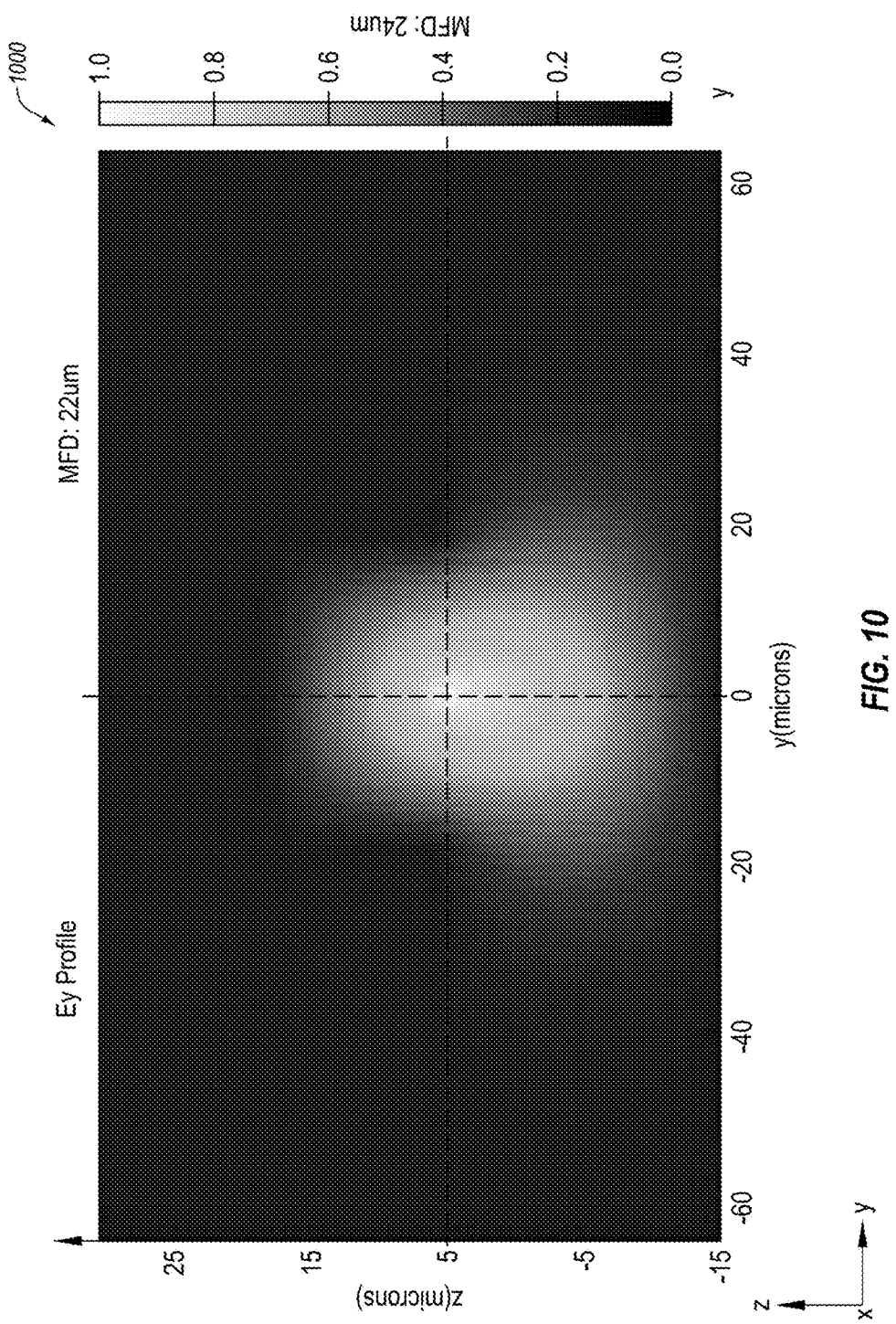
FIG. 10 illustrates a simulated input optical mode of the LOI of FIG. 9.

FIG. 10 illustrates a simulated supported optical mode 1000 of the LOI 900 of FIG. 9, arranged in accordance with at least one embodiment described herein. The simulation of FIG. 10 shows an effective index Neff of the LOI 900 at its input end is Neff=1.4463+i1.49E-6, which may correspond to a propagation loss of 0.62 dB/cm. In FIG. 10, the simulated supported optical mode 1000 has a mode field diameter in the vertical direction (MFD(v)) of about 22 µm, a mode field diameter in the horizontal direction (MFD(h)) of about 24 µm, and a mode overlap with a 30 µm Gaussian optical mode (e.g., the assumed optical mode for the GCL laser output) of 91%, or a 0.45 dB coupling loss.

FIG. 11A includes a cross-sectional view of another example LOI 1100, arranged in accordance with at least one embodiment described herein. The LOI 1100 may include or correspond to one or more of the other LOIs described herein. The LOI 1100 may include a first waveguide core 1102, a cladding 1104, and a substrate 1106 may be the same as or similar to the waveguide core 902, the cladding 904, and the substrate 906 of FIG. 9. Alternatively or additionally, the LOI 1100 may include an air cladding (not illustrated). The LOI 1100 additionally includes a second waveguide core 1108 vertically positioned above the first waveguide core 1102. The first and second waveguide cores 1102 and 1108 may be separated by cladding 1104 or other materials or layers. The first and second waveguide cores 1102 and 1108 may be separated by a distance d. The distance d may be about 25 nm in some embodiments. The first and second waveguide cores 1102 and 1108 may include SiN or other suitable materials.

FIG. 11B includes an overhead view of the first and second waveguide cores 1102, 1108, arranged in accordance with at least one embodiment described herein. With combined reference to FIGS. 11A and 11B, the LOI 1100 may include a low-contrast waveguide (LCWG) section 1110, a SSC section 1112, a high-contrast waveguide (HCWG) section 1114, and an evanescent coupling section 1116.

In the LCWG section 1110, the second waveguide core 1108 is absent and the first waveguide core 1102 has a width $w_{core1}$ (e.g., in the y direction) that tapers laterally outward from a tip width to an intermediate width. In some embodiments, the tip width may be about 0.5 µm and the intermediate width may be about 7-8 µm. In the LCWG section 1110, the LOI waveguide of the LOI 1100 may have a low index contrast to accommodate a relatively larger optical mode 1118 that may match or substantially match an optical mode of light output by a GCL laser. The optical mode 1118 may be relatively weakly guided by the LCWG section 1110.

The first waveguide core 1102 may have a constant width (e.g., equal to the intermediate width) in one or more of the SSC section 1112, the HCWG section 1114, and the evanescent coupling section 1116. In other embodiments, the first waveguide core 1102 may have a variable width in one or more of the SSC section 1112, the HCWG section, and the evanescent coupling section 1116.

In the SSC section 1112, which may also be referred to as a vertical taper section, the second waveguide core 1108 may have a thickness $t_{core2}$ (e.g., in the z direction) that tapers vertically upward from a tip thickness to an intermediate thickness. The tip thickness may be about 0 nm and the intermediate thickness may be about 250 nm. The SSC section 1112 may convert a relatively weakly guided optical mode from the LCWG section 1110 to a more highly confined optical mode. For example, the optical mode 1118 may enter the SSC section 1112 and get converted partially through the SSC section 1112 to a more confined optical mode 1120 and then by the end of the SSC section 1112 to an even more highly confined optical mode 1122.

FIG. 11A additionally illustrates an example Si PIC 1124 that may include, among others, a substrate 1126, a SiN waveguide core 1128, and cladding 1130. The SiN waveguide core 1128 may have a tapered end aligned in the y and z directions with the second waveguide core 1108 in the evanescent coupling section 1116 and spaced apart from the second waveguide core 1108 in the x direction. The SiN waveguide core 1128 and the cladding 1130 may form a SiN waveguide of the Si PIC 1124.

In the HCWG section 1114, the optical mode 1122 may generally be maintained. However, near or after an end of the HCWG section 1114, the optical mode 1122 may begin to evanescently couple to the SiN waveguide of the Si PIC 1124, as represented by optical mode 1132. By the end of the evanescent coupling section 1116, most of the light from the LOI 1100 may be coupled into the Si PIC 1124, as represented by optical mode 1134.

The second waveguide core 1108 is illustrated in FIG. 11B as having a width $w_{core2}$ that is constant throughout the SSC section 1112, the HCWG section 1114, and the evanescent coupling section 1116. In other embodiments, the width $w_{core2}$ of the second waveguide core 1108 may vary (e.g., by lateral taper) in one or more of the SSC section 1112, the HCWG section 1114, and the evanescent coupling section 1116.

In some embodiments, following the evanescent coupling section 1116, the thickness $t_{core2}$ of the second waveguide core 1108 may taper vertically downward from the intermediate thickness to the tip thickness.

Figure 12:
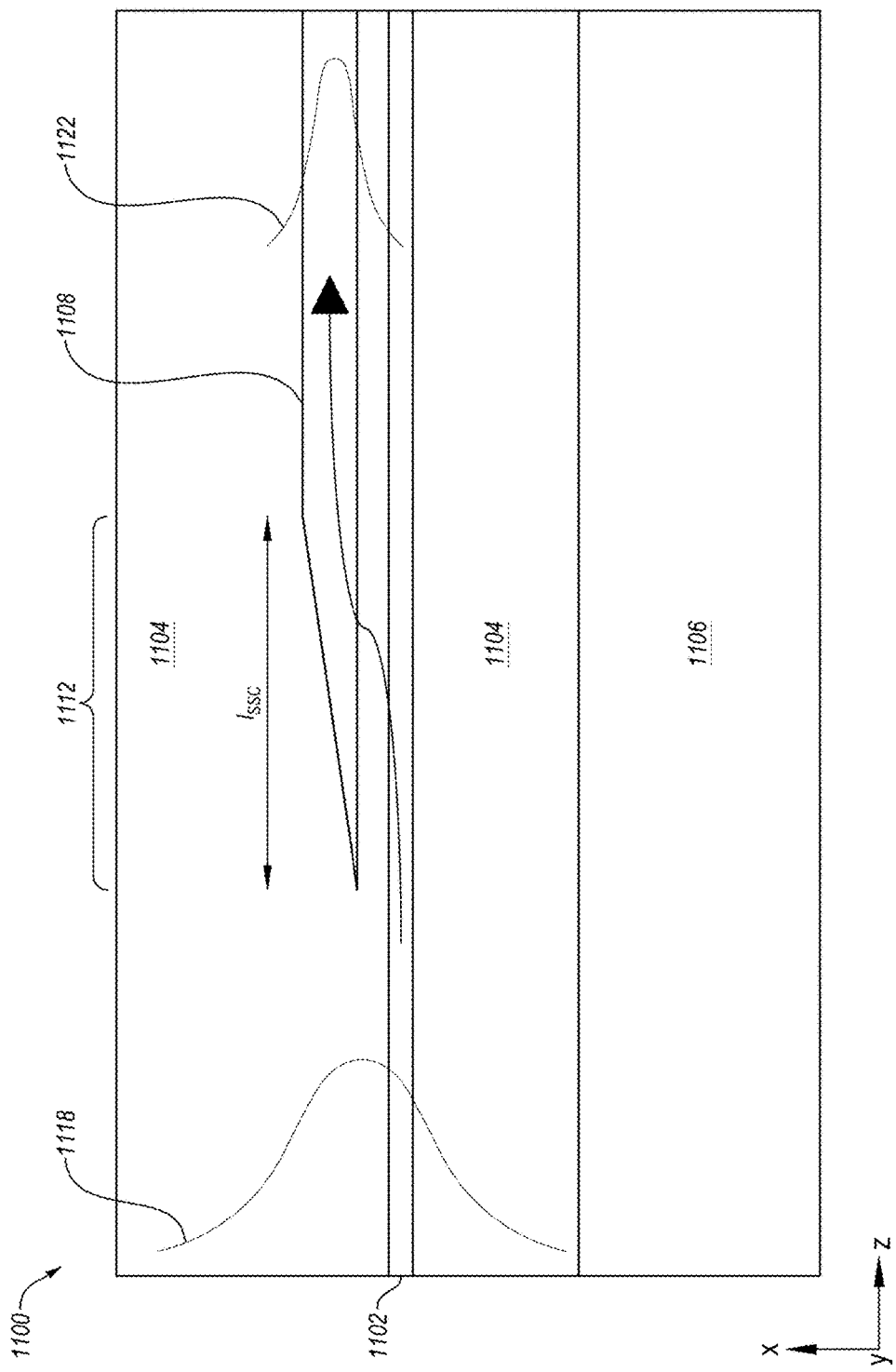
FIG. 12 illustrates a portion of the LOI of FIG. 11A.

FIG. 12 illustrates a portion of the LOI 1100 of FIG. 11A, arranged in accordance with at least one embodiment described herein. FIG. 12 additionally illustrates light 1202 that may have the various optical modes 1118, 1120 (FIG. 11A), 1122 as it propagates through the LOI 1100. The SSC section 1112 may have a length $l_{SSC}$. The length $l_{SSC}$ of the SSC section 1112 may influence conversion efficiency from the optical mode 1118 to the optical mode 1122 in the LOI 1100. Conversion loss in the SSC section 1112 may be simulated by the Eignemode expansion method (Lumerical EME).

Figure 13:
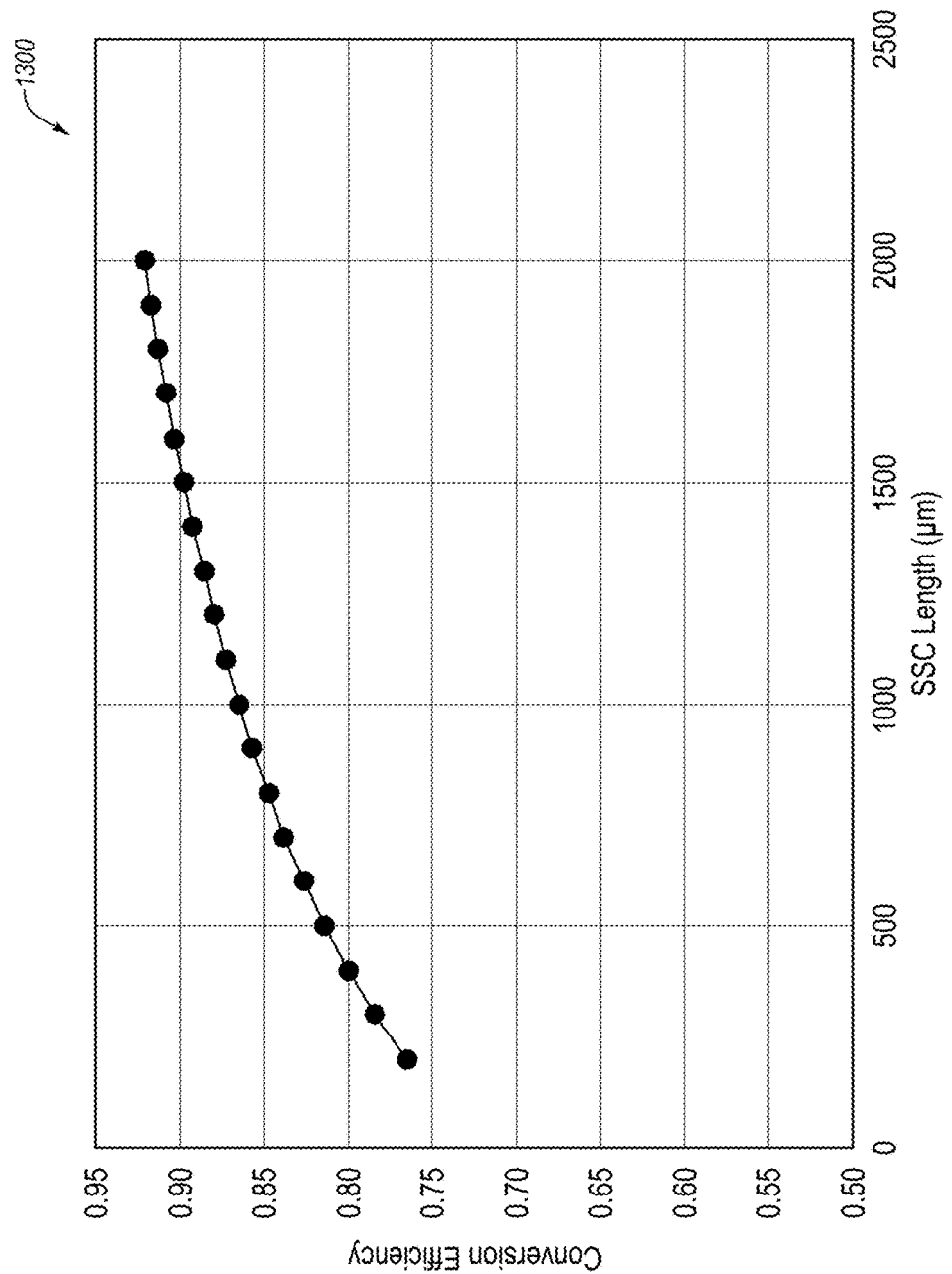
FIG. 13 is a simulation of conversion efficiency as a function of length of a SSC section of the LOI of FIG. 11A.

FIG. 13 is a simulation 1300 of conversion efficiency as a function of length $l_{SSC}$ of the SSC section 1112, arranged in accordance with at least one embodiment described herein. As illustrated in FIG. 13, the conversion efficiency may exceed 90% for length $l_{SSC}$ of the SSC section 1112 of 1.5 millimeters (mm) or longer.

Figure 14:
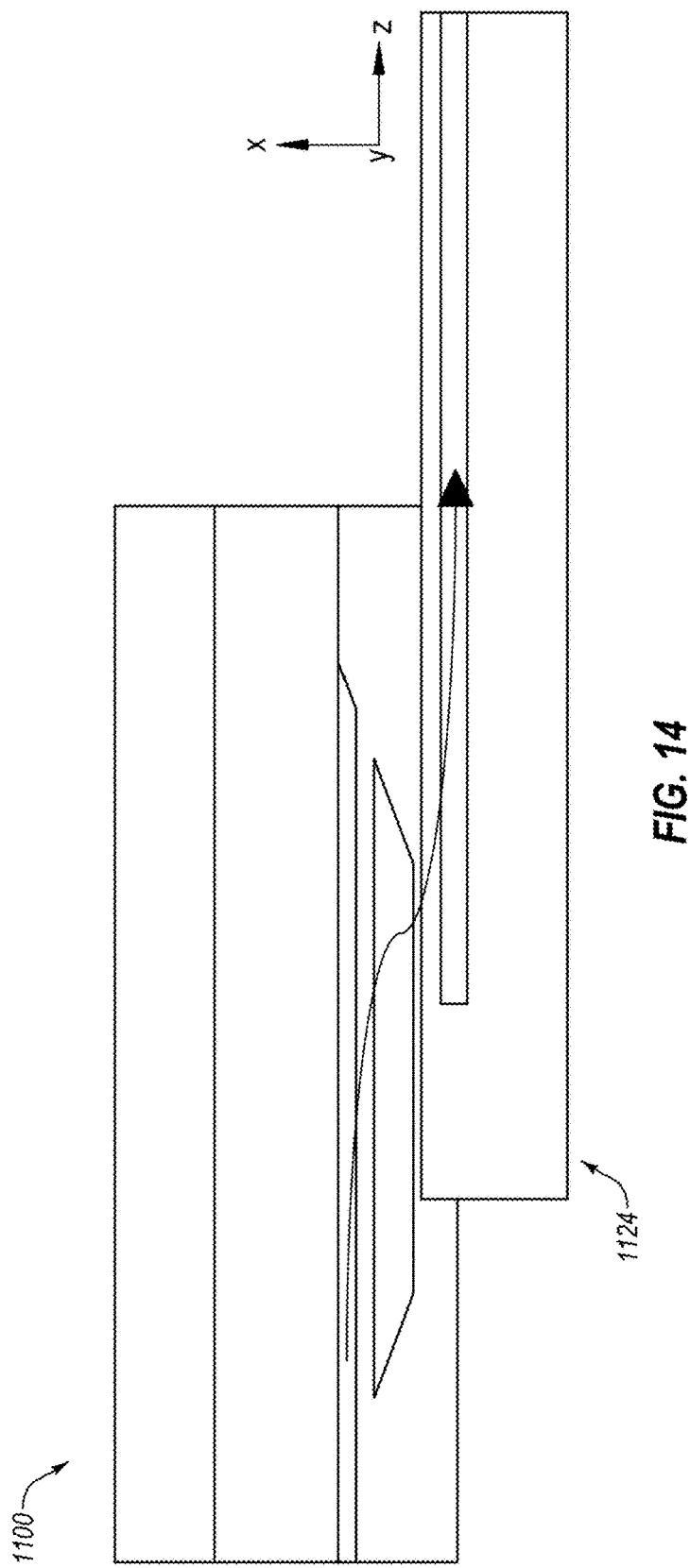
FIG. 14 illustrates the LOI and a Si PIC of FIG. 11A.

FIG. 14 illustrates the LOI 1100 and the Si PIC 1124 of FIG. 11A, arranged in accordance with at least one embodiment described herein. The total coupling loss of light as it travels from a corresponding GCL laser through the LOI 1100 to the Si PIC 1124 may be about 1 dB or less or in some embodiments. Due to the close match (e.g., overlap) between the optical mode of the GCL laser and the optical mode at the input end of the LOI 1100, the total coupling loss may include about a 0.45 dB loss from the GCL laser to the LOI 1100. If the SSC section 1112 (see FIGS. 11A and 12) has a length greater than 1.5 mm, the total coupling loss may also include about 0.45 dB from the SSC section 1112. The total coupling loss may also include about 0.1 dB loss for the transition from the LOI 1100 to the Si PIC 1124. Thus, the total coupling loss may be about 0.45 dB+0.45 dB+0.1 dB=1 dB.

Surface coupled systems that include a GCL laser, an optical isolator, a LOI, and a Si PIC may direct light from the GCL laser into the LOI waveguide of the LOI in any of a variety of ways, some of which are illustrated in FIGS. 15-20. FIGS. 15-20 include the LOI 1100 and the Si PIC 1124 of FIG. 11A as an example. Other LOIs and/or Si PICs may be implemented in their place in other embodiments.

Figure 15:
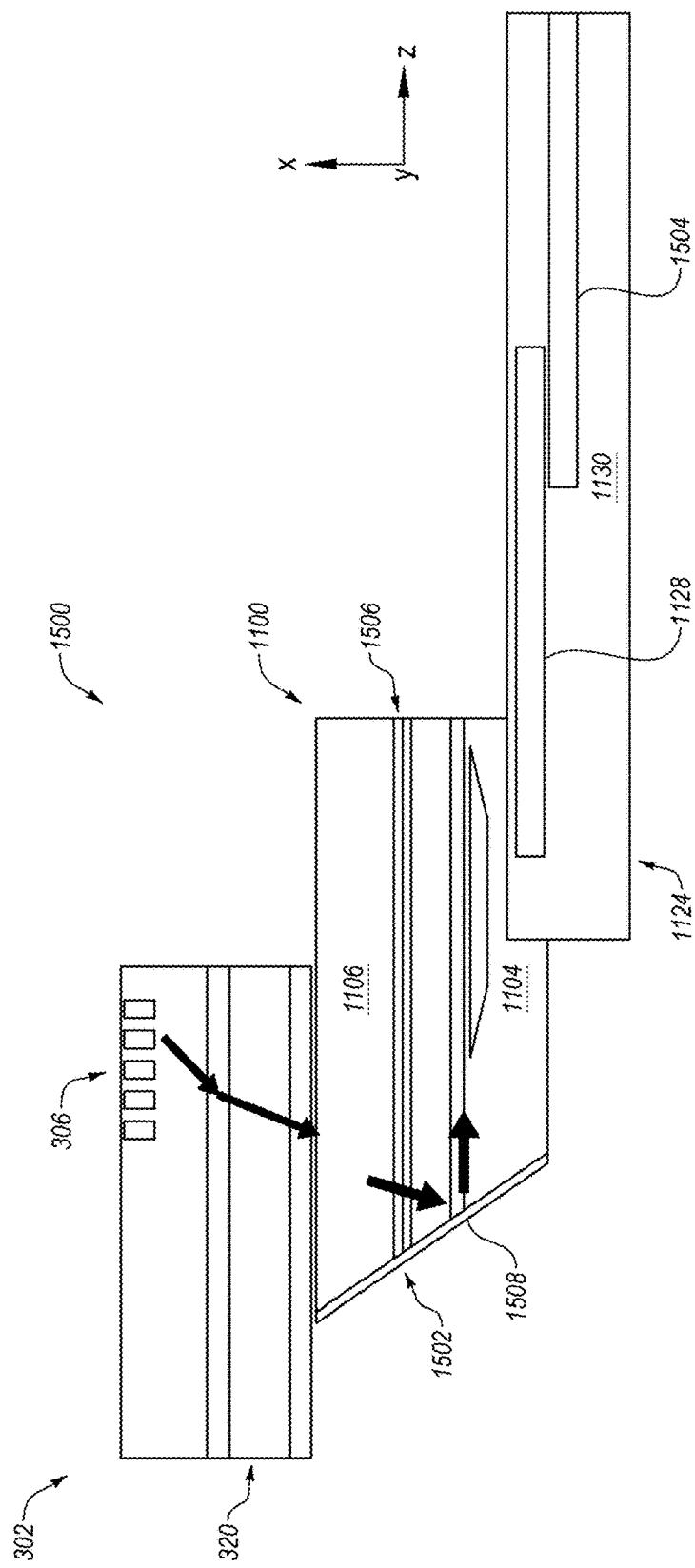
FIG. 15 illustrates an example surface coupled system with a first laser-to-LOI coupling configuration.

In more detail, FIG. 15 illustrates an example surface coupled system 1500 with a first laser-to-LOI coupling configuration, arranged in accordance with at least one embodiment described herein. The surface coupled system 1500 includes the GCL laser 302 with the first surface grating 306, the optical isolator 320, the LOI 1100, and the Si PIC 1124. The GCL laser 302 may be coupled to the optical isolator 320 in this and other embodiments.

The embodiment of the LOI 1100 illustrated in FIG. 15 includes an input interface 1502. The embodiment of the Si PIC 1124 illustrated in FIG. 15 includes both the SiN waveguide core 1128 and a Si waveguide core 1504 surrounded by cladding 1130. The first laser-to-LOI coupling configuration uses the input interface 1502 to redirect light from the GCL laser 302 into the LOI waveguide of the LOI 1100, similar to the surface coupled system 300 described above. The input interface 1502 may have an interface angle determined as described above with respect to the surface coupled system 300.

In some embodiments, and as illustrated in FIG. 15, the LOI 1100 may include one or more antireflection coating layers 1506 between the substrate 1106 and the cladding 1104 of the LOI 1104 to minimize or at least reduce back-reflection of the light emitted by the GCL laser 302. Other embodiments of the LOI 1100 or other LOIs illustrated in other Figures may similarly include one or more antireflection coating layers between the substrate and the cladding.

In some embodiments, and as illustrated in FIG. 15, the Si Substrate 1124 may include the Si waveguide core 1504 included in a layer above or below the SiN waveguide core 1128. The Si waveguide core 1504 with surrounding cladding 1130 may form a Si waveguide. The SiN waveguide and the Si waveguide of the Si PIC 1124 may be adiabatically coupled together, e.g., as described in the '066 patent.

In FIG. 15, the GCL laser 302 and the optical interposer 320 may be directly attached to the LOI 1100, e.g., to a bottom or backside of the LOI 1100. The input interface 1502 may be realized as an angled facet by polishing or other process. A high reflective (HR) coating 1508 may be applied to the input interface 1502 in some embodiments, while in other embodiments (e.g., in the case of total internal reflection (TIR)) the HR coating 1508 may be omitted. To use the input interface 1502 as a TIR mirror without the HR coating 1508, equations (1)-(4) above may be used to determine the angle of the input interface 1502.

Figure 16:
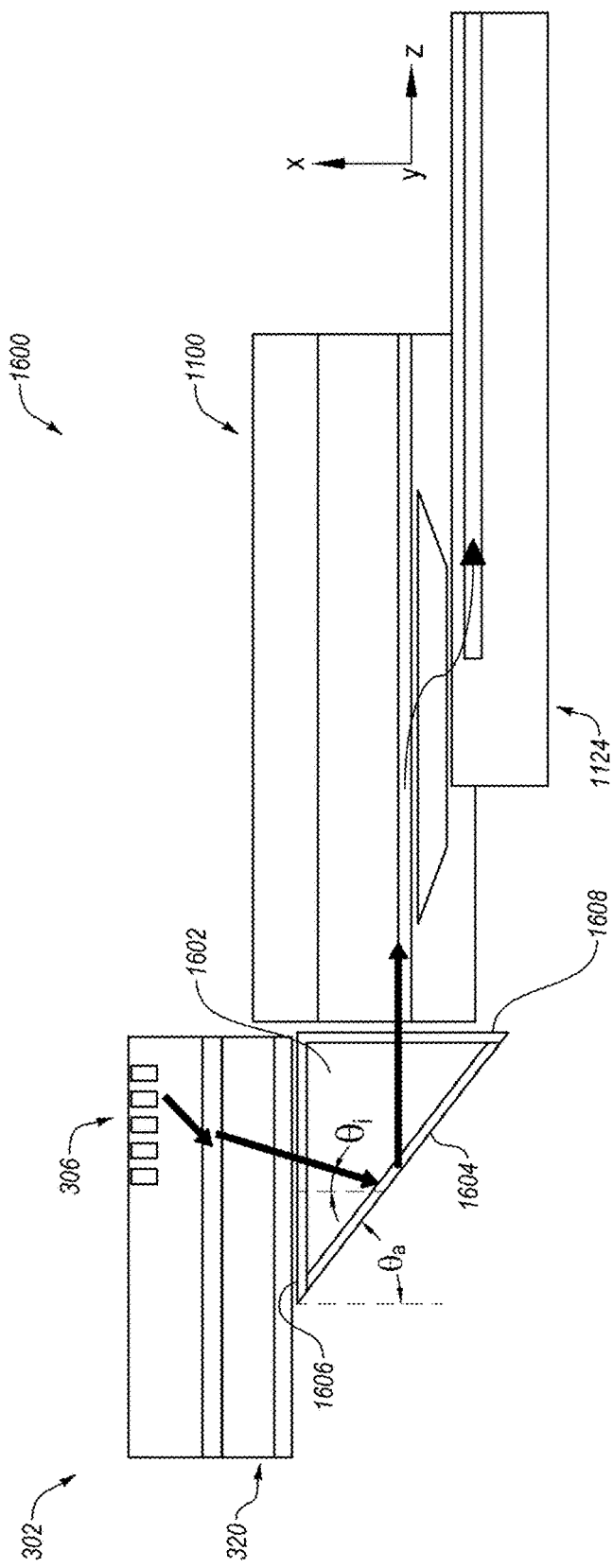
FIG. 16 illustrates another example surface coupled system with a second laser-to-LOI coupling configuration.

FIG. 16 illustrates another example surface coupled system 1600 with a second laser-to-LOI coupling configuration, arranged in accordance with at least one embodiment described herein. The surface coupled system 1600 includes the GCL laser 302 with the first surface grating 306, the optical isolator 320, the LOI 1100, and the Si PIC 1124. The surface coupled system 1600 additionally includes a micro-prism 1602 to implement the second laser-to-LOI coupling configuration.

The micro-prism 1602 may be assembled together with the GCL laser 302 and the optical isolator 320 to convert the light propagation direction from the GCL laser 302 and the optical isolator 320 into the waveguide of the LOI 1100. The micro-prism 1602 may be a right-angle prism with its larger surface (e.g., the surface corresponding to the hypotenuse of the right angle) having a prism angle $\theta_a$ determined by an angle of incidence $\theta_i$ of light inside the micro-prism 1602. In the configuration of FIG. 16, the prism angle $\theta_a$ may be determined according to equation 5:

$$\theta_a = (90° - \theta_i)/2 \tag{5}$$

In some embodiments, the micro-prism 1602 may include BK7 glass (n~1.5) or other suitable material. The GCL laser 302, the optical isolator 320, and the micro-prism 1602 may be coupled together as a unit and actively aligned to the LOI 1100 and Si PIC 1124 in some embodiments. Alternatively or additionally, the micro-prism 1602 may include a HR coating 1604 on some or all of its larger surface and/or one or more AR coating layers 1606, 1608 at interfaces with the optical isolator 320 and the LOI 1100.

The micro-prism 1602 may have a length l. The length l of the micro-prism 1602 may be about 200 µm in some embodiments.

Figure 17:
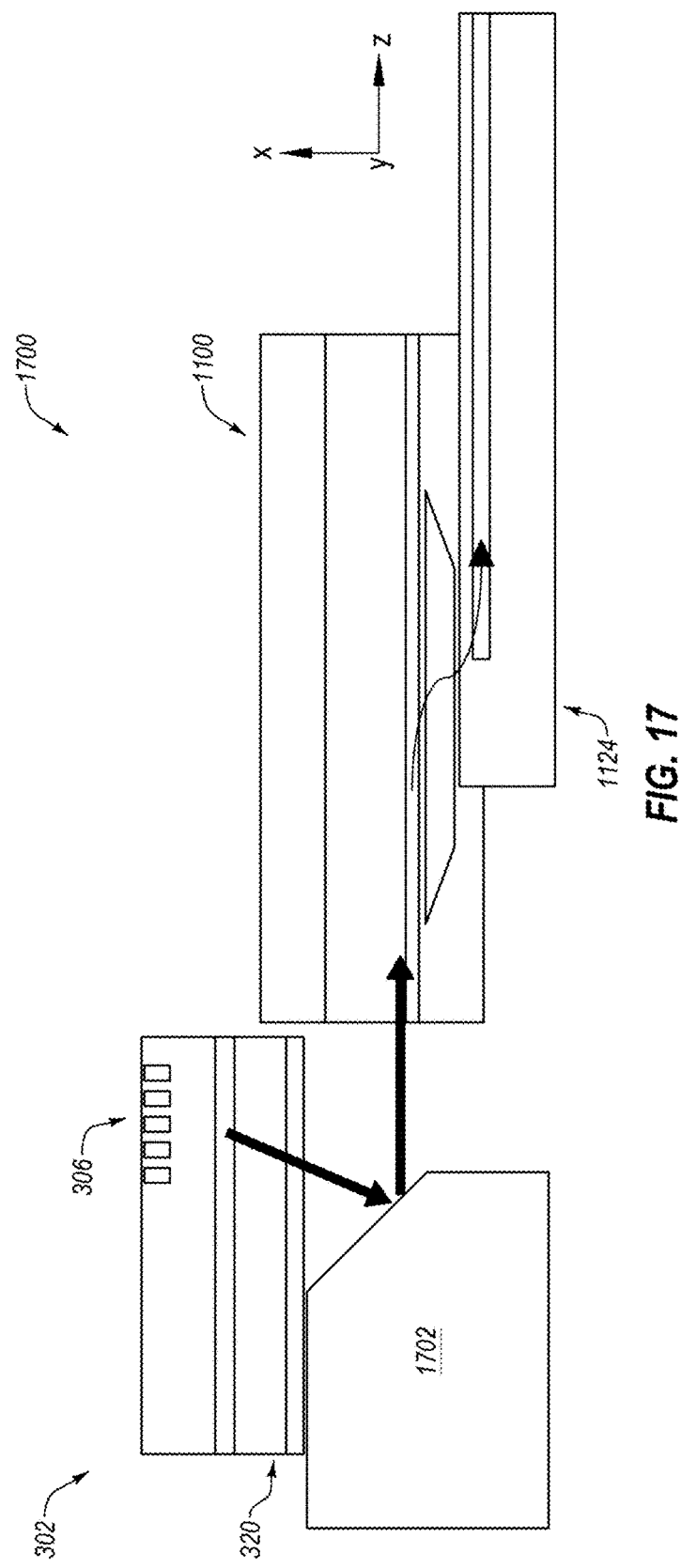
FIG. 17 illustrates another example surface coupled system with a third laser-to-LOI coupling configuration.

FIG. 17 illustrates another example surface coupled system 1700 with a third laser-to-LOI coupling configuration, arranged in accordance with at least one embodiment described herein. The surface coupled system 1700 includes the GCL laser 302 with the first surface grating 306, the optical isolator 320, the LOI 1100, and the Si PIC 1124. The surface coupled system 1700 additionally includes a Si mirror 1702 to implement the third laser-to-LOI coupling configuration.

The Si mirror 1702 may be fabricated by wet etch on a Si bench. A precise mirror angle of the Si mirror 1702 may be defined by crystal planes. The third laser-to-LOI coupling configuration of FIG. 17 may have a simple integration flow using all parallel components.

Figure 18:
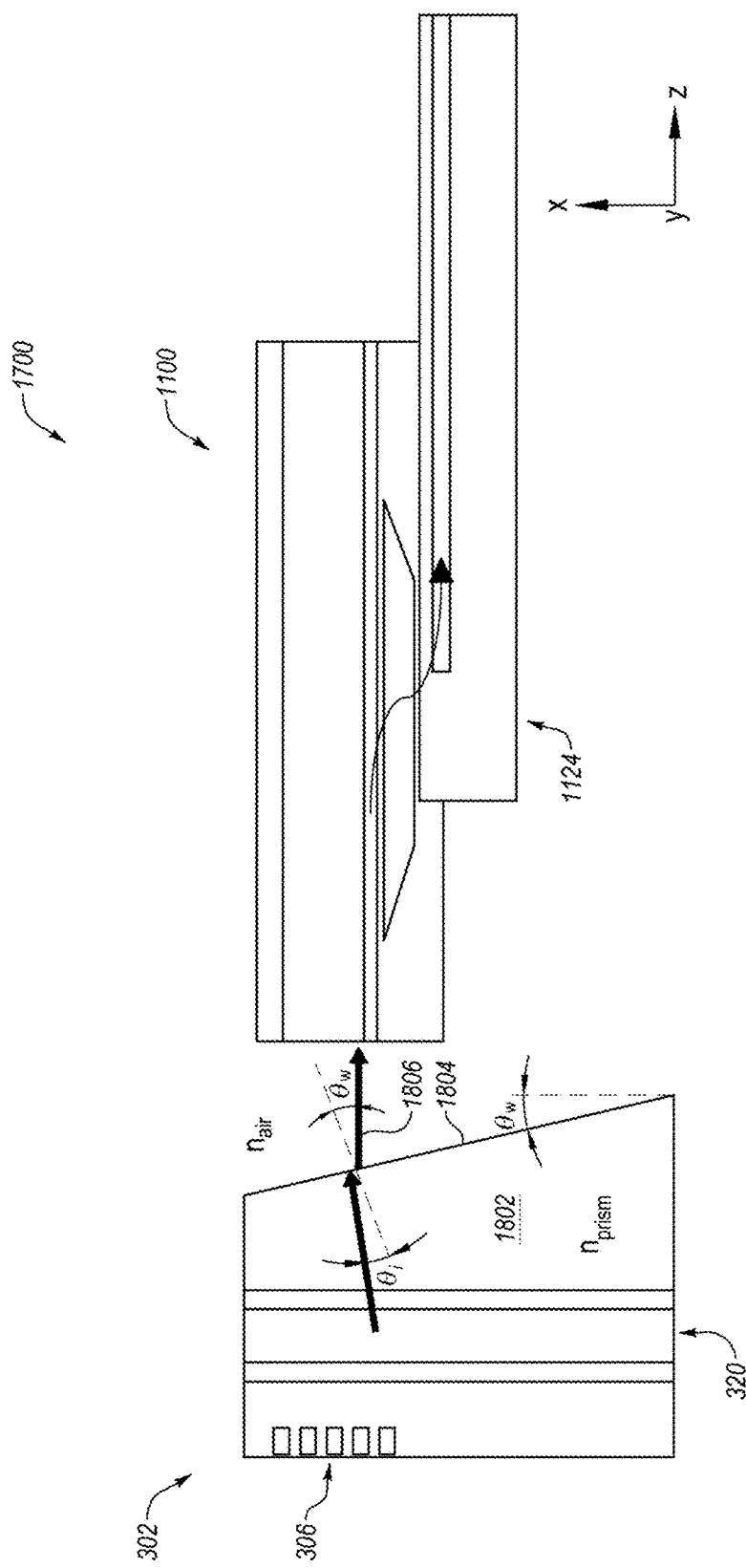
FIG. 18 illustrates another example surface coupled system with a fourth laser-to-LOI coupling configuration.

FIG. 18 illustrates another example surface coupled system 1800 with a fourth laser-to-LOI coupling configuration, arranged in accordance with at least one embodiment described herein. The surface coupled system 1800 includes the GCL laser 302 with the first surface grating 306, the optical isolator 320, the LOI 1100, and the Si PIC 1124. The surface coupled system 1800 additionally includes a wedge prism 1802, with the GCL laser 302, the optical isolator 320, and the wedge prism 1802 packaged together as a unit and rotated 90 degrees to implement the fourth laser-to-LOI coupling configuration.

The wedge prism 1802 may have an index of refraction $n_{prism}$ and a wedge angle $\theta_w$ (e.g., of bottom surface 1804 relative to vertical). The wedge angle $\theta_w$ may be determined by the emission angle $\theta_i$ of light 1806 from the GCL laser 302 according to equation 6:

$$\theta_w = \sin^{-1}[(n_{prism}/n_{air})*\sin \theta_i] \tag{6}$$

The fourth laser-to-LOI coupling configuration of FIG. 18 may eliminate use of a high-reflecting plane (as in FIGS. 15-17) to reduce potential loss that may arise from non-perfect reflectivity of such a plane.

Figure 19:
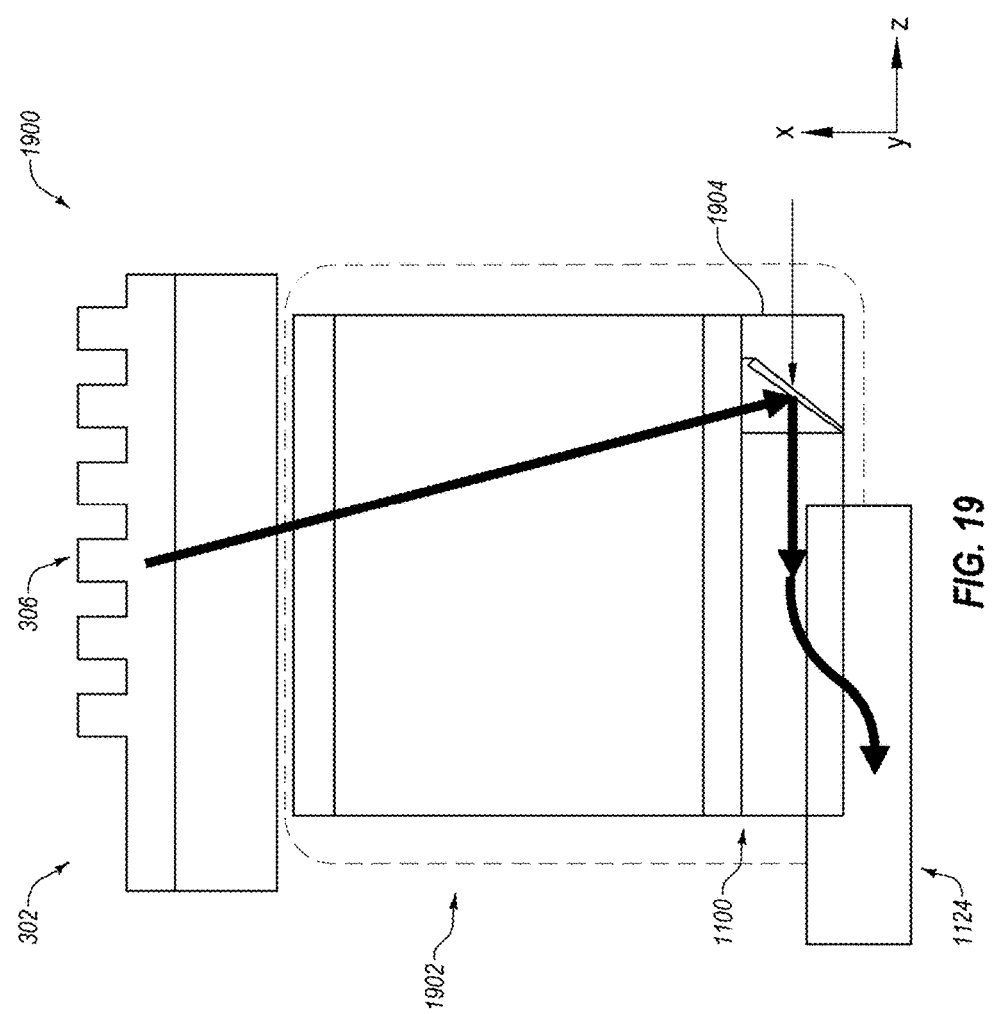
FIG. 19 illustrates another example surface coupled system with a fifth laser-to-LOI coupling configuration.

FIG. 19 illustrates another example surface coupled system 1900 with a fifth laser-to-LOI coupling configuration, arranged in accordance with at least one embodiment described herein. The surface coupled system 1900 includes the GCL laser 302 with the first surface grating 306, an optical isolator 1902, the LOI 1100, and the Si PIC 1124. The optical isolator 1902 may be the same as or similar to other optical isolators described herein, and/or may include mirror 1904 integrally formed with or attached to a bottom of the optical isolator 1902 to implement the fifth laser-to-LOI coupling configuration.

The mirror 1904 may include a Si mirror, a metal mirror, or other suitable mirror. For example, the mirror 1904 may include a wet etched Si mirror for accurate angle. A wafer level process may be implemented to package the optical isolator 1902, the mirror 1904 and the LOI 1100 together, e.g., as a unitary component.

Figure 20:
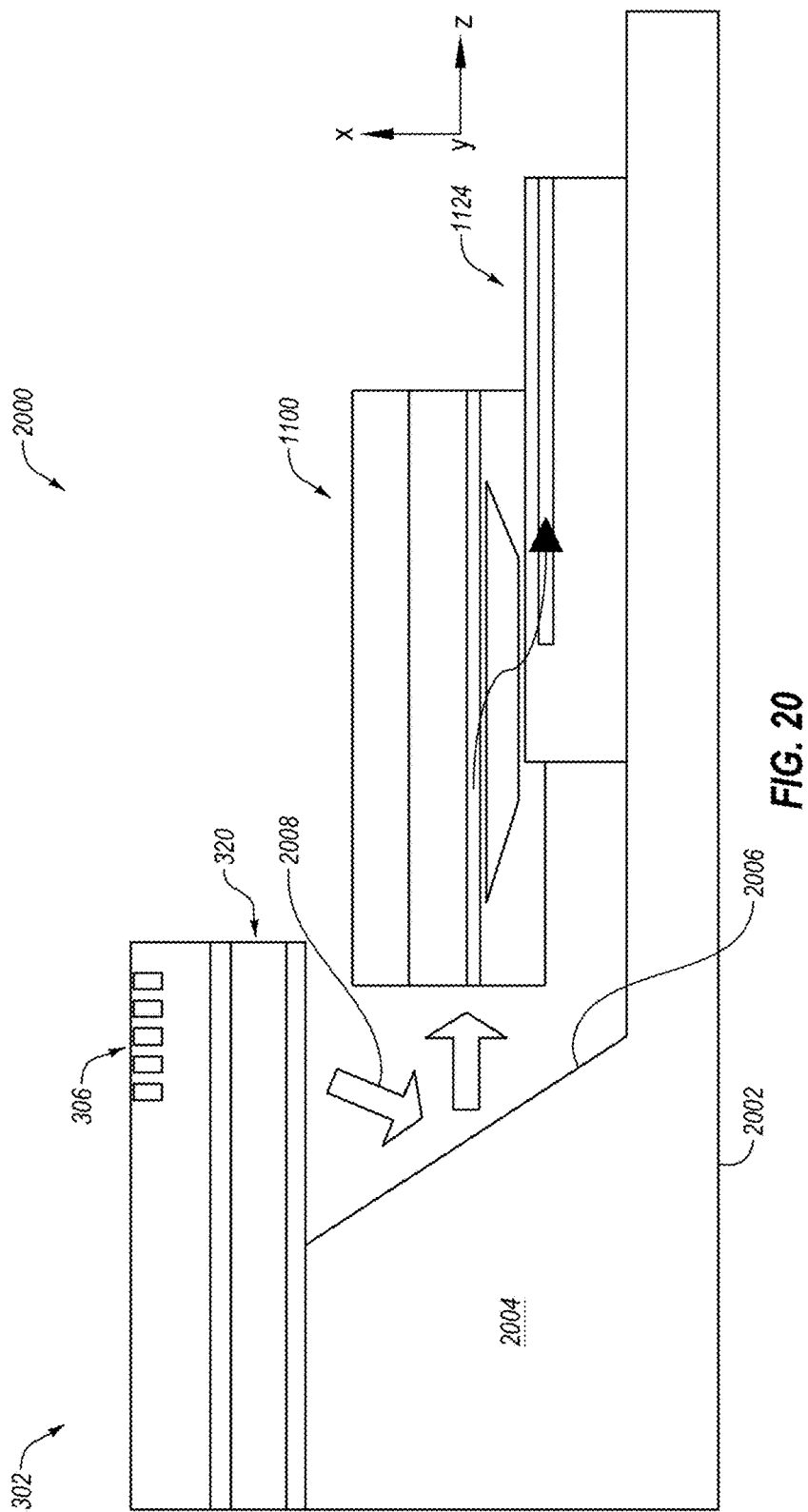
FIG. 20 illustrates another example surface coupled system with a sixth laser-to-LOI coupling configuration, all arranged in accordance with at least one embodiment described herein.

FIG. 20 illustrates another example surface coupled system 2000 with a sixth laser-to-LOI coupling configuration, arranged in accordance with at least one embodiment described herein. The surface coupled system 2000 includes the GCL laser 302 with the first surface grating 306, the optical isolator 320, the LOI 1100, and the Si PIC 1124. The surface coupled system 2000 additionally includes a Si optical bench 2002 with a platform 2004 and an angled facet 2006 to implement the sixth laser-to-LOI coupling configuration.

The Si optical bench 2002 may provide a high-reflective well-defined angled facet 2006 of, e.g., 54.7 degrees in an example embodiment, by Si crystal plane. The GCL laser 302 and the optical isolator 320 coupled together as a unit may be mounted to the platform 2004 of the Si optical bench 2002. The LOI 1100 and the Si PIC 1124 may also be mounted to the platform 2004 with the LOI 1100 positioned to receive into its LOI waveguide light 2008 emitted by the GCL laser 302 through the optical isolator 320 and reflected from the angled facet 2006. Accordingly, the Si optical bench 2002 may provide a common mounting platform for the other components of the surface coupled system 2000.

Assembly of surface coupled systems according to the sixth laser-to-LOI coupling configuration of FIG. 20 has the potential to be a wafer-level process, which may reduce costs compared to other processes.

Accordingly, FIGS. 3 and 15-20 disclose various components to redirect light emitted by the GCL laser 302, after the light has passed through a corresponding optical isolator 320 or 1902, into the LOI waveguide of the LOI 1100. The components that redirect the light may be generically referred to as light redirectors, one or more of which may be included in some surface coupled systems to redirect the light from the output of the optical isolator into the LOI waveguide of the LOI. More particularly, each light redirector may redirect the light to propagate into and through the LOI waveguide. For example, a given light redirector may redirect the light so that it is generally propagating parallel to and within the LOI waveguide.

Various surface coupled systems described herein include a GCL laser, an optical isolator, a LOI, and a light redirector. Such systems may optionally further include a Si PIC or SMF. Alternatively or additionally, some embodiments may omit the optical isolator and may include a GCL laser, a LOI, and a light redirector. For example, one or more of the embodiments illustrated in one or more of the Figures may be modified to omit the optical isolator.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
    a grating coupled laser comprising a laser cavity and a transmit grating optically coupled to the laser cavity, the laser cavity and the transmit grating formed in a same layer of the grating coupled laser, the transmit grating configured to diffract light emitted by the laser cavity out of the grating coupled laser;
    a laser optical interposer (LOI) comprising an LOI waveguide with an input end and an output end, wherein the LOI waveguide includes a waveguide core and cladding, the waveguide core includes a taper at the input end of the LOI waveguide, and the input end of the LOI waveguide has an optical mode that overlaps an optical mode of the light output by the grating coupled laser by at least 70%;
    an optical isolator positioned between the grating coupled laser and the LOI; and
    a light redirector positioned to redirect the light, after the light passes through the optical isolator, into the LOI waveguide of the LOI.

2. The system of claim 1, wherein the optical mode of the input end of the LOI waveguide has a $w_0$ parameter in a range from 10 micrometers (μm) to 15 μm.

3. The system of claim 1, further comprising a silicon (Si) photonic integrated circuit (PIC) that includes a waveguide with a tapered end positioned beneath an output end of the LOI waveguide, the tapered end of the waveguide aligned in two orthogonal directions with the output end of the LOI, the LOI waveguide and the waveguide in the Si PIC forming an adiabatic coupler.

4. The system of claim 3, wherein the output end of the LOI waveguide has an optical mode that overlaps an optical mode of the waveguide of the Si PIC by at least 70%.

5. The system of claim 4, wherein the optical mode of the output end of the LOI waveguide has a $w_0$ parameter in a range from 4 micrometers (μm) to 5 μm.

6. The system of claim 1, further comprising a single mode fiber butt-coupled to the laser optical interposer.

7. The system of claim 6, wherein the LOI waveguide has an output end to output the light into the single mode fiber and wherein the output end has an optical mode that overlaps an optical mode of the single mode fiber by at least 70%.

8. The system of claim 7, wherein the optical mode of the output end has a $w_0$ parameter in a range from 4 micrometers (μm) to 5 μm.

9. The system of claim 1, wherein the light redirector comprises an angled input interface formed in the LOI.

10. The system of claim 9, further comprising a high reflective coating formed on the angled input interface.

11. The system of claim 1, wherein the light redirector comprises a micro-prism coupled to the optical isolator and between the optical isolator and the LOI.

12. The system of claim 1, wherein the light redirector comprises a mirror that includes an angled facet optically located between the optical isolator and the LOI.

13. The system of claim 12, wherein the mirror comprises a Si mirror or metal mirror coupled to a bottom of the optical isolator and packaged as a unit together with the optical isolator and the LOI.

14. The system of claim 1, wherein:
    the grating coupled laser is oriented with the transmit grating normal to the LOI waveguide; and
    the light redirector comprises a wedge prism coupled to a bottom of the optical isolator.

15. The system of claim 1, wherein:
    the light redirector comprises a silicon (Si) optical bench with a platform and an angled facet;
    the grating coupled laser and the optical isolator are mounted to the platform of the Si optical bench;
    the angled facet is optically located between the optical isolator and the LOI; and
    the LOI is mounted to a lower portion of the Si optical bench that is lower than the platform.

16. The system of claim 1, wherein the waveguide core has a cross-sectional profile that includes a rib and a ridge that extends upward from the rib, wherein a width of the ridge is less than a width of the rib.

17. The system of claim 1, wherein the waveguide core comprises a first waveguide core and wherein the LOI waveguide further comprises a second waveguide core that is parallel to and vertically spaced apart from the first waveguide core.

18. The system of claim 17, wherein:
    the first waveguide core comprises a silicon nitride (SiN) waveguide core that tapers outward in width along at least a portion of a length of the SiN waveguide core in a light propagation direction; and
    the second waveguide core comprises a silicon (Si) waveguide core that tapers inward in width along at least a portion of a length of the Si waveguide core in the light propagation direction.

19. The system of claim 17, wherein:
the first waveguide core tapers outward in width along at least a portion of a length of the first waveguide core in a light propagation direction; and
the second waveguide core tapers vertically upward in thickness along at least a portion of a length of the second waveguide core in the light propagation direction.

20. A system comprising:
a grating coupled laser chip comprising a layer that includes a laser cavity, a waveguide core, and a transmit grating optically coupled to the waveguide core and the laser cavity, the transmit grating configured to diffract light emitted by the laser cavity out of the grating coupled laser chip;
a laser optical interposer (LOI) comprising an LOI waveguide with an input end and an output end;
an optical isolator positioned between the grating coupled laser chip and the LOI;
a light redirector positioned to redirect the light, after the light passes through the optical isolator, into the LOI waveguide of the LOI; and
a silicon (Si) photonic integrated circuit (PIC) that includes a waveguide with a tapered end positioned beneath an output end of the LOI waveguide, the tapered end of the waveguide aligned in two orthogonal directions with the output end of the LOI, the LOI waveguide and the waveguide in the Si PIC forming an adiabatic coupler.

21. The system of claim 20, wherein:
the output end of the LOI waveguide has a first optical mode;
the waveguide of the Si PIC has a second optical mode; and
the first optical mode overlaps the second optical mode by at least 70%.

22. The system of claim 21, wherein the optical mode of the output end of the LOI waveguide has a $w_0$ parameter in a range from 4 micrometers (μm) to 5 μm.

23. The system of claim 20, wherein the LOI waveguide comprises at least one waveguide core and cladding and wherein the waveguide core has a cross-sectional profile that includes a rib and a ridge that extends upward from the rib, wherein a width of the ridge is less than a width of the rib.

24. The system of claim 20, wherein the LOI waveguide comprises two parallel waveguide cores vertically spaced apart from each other.

25. The system of claim 24, wherein the two parallel waveguide cores comprise:
a silicon nitride (SiN) waveguide core that tapers outward in width along at least a portion of a length of the SiN waveguide core in a light propagation direction; and
a silicon (Si) waveguide core that tapers inward in width along at least a portion of a length of the Si waveguide core in the light propagation direction.

26. The system of claim 24, wherein the two parallel waveguide cores comprise:
a first waveguide core that tapers outward in width along at least a portion of a length of the first waveguide core in a light propagation direction; and
a second waveguide core that tapers vertically upward in thickness along at least a portion of a length of the second waveguide core in the light propagation direction.

* * * * *